United States Patent
Niskanen et al.

(10) Patent No.: US 9,824,881 B2
(45) Date of Patent: *Nov. 21, 2017

(54) SI PRECURSORS FOR DEPOSITION OF SIN AT LOW TEMPERATURES

(71) Applicant: ASM IP HOLDING B.V., Almere (NL)

(72) Inventors: Antti J. Niskanen, Helsinki (FI); Shang Chen, Helsinki (FI); Viljami Pore, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/830,084

(22) Filed: Mar. 14, 2013

(65) Prior Publication Data

US 2014/0273528 A1    Sep. 18, 2014

(51) Int. Cl.
   *H01L 21/02*    (2006.01)
   *C23C 16/34*    (2006.01)
   (Continued)

(52) U.S. Cl.
   CPC ........ *H01L 21/0217* (2013.01); *C23C 16/345* (2013.01); *C23C 16/45553* (2013.01);
   (Continued)

(58) Field of Classification Search
   CPC ............. H01L 29/66772; H01L 21/318; H01L 29/7831; H01L 21/02219; H01L 21/26;
   (Continued)

(56) References Cited

U.S. PATENT DOCUMENTS 4,683,147 A * 7/1987 Eguchi et al. ................. 427/583
4,696,834 A * 9/1987 Varaprath ................ 427/249.19
(Continued)

FOREIGN PATENT DOCUMENTS

JP    2006/190770    7/2006
JP    2013/125762    6/2013
(Continued)

OTHER PUBLICATIONS

Loewenstein, LM, and CM Tipton. "Chemical etching of thermally oxidized silicon nitride: comparison of wet dry etching methods." Journal of the Electrochemical Society 138.5 (1991): 1389-1394.*
(Continued)

*Primary Examiner* — Bitew Dinke
(74) *Attorney, Agent, or Firm* — Knobbe, Martens, Olson & Bear LLP

(57) ABSTRACT

Methods and precursors for depositing silicon nitride films by atomic layer deposition (ALD) are provided. In some embodiments the silicon precursors comprise an iodine ligand. The silicon nitride films may have a relatively uniform etch rate for both vertical and the horizontal portions when deposited onto three-dimensional structures such as FinFETS or other types of multiple gate FETs. In some embodiments, various silicon nitride films of the present disclosure have an etch rate of less than half the thermal oxide removal rate with diluted HF (0.5%).

25 Claims, 6 Drawing Sheets

(51) Int. Cl.
*C23C 16/455* (2006.01)
*H01L 29/66* (2006.01)

(52) U.S. Cl.
CPC .... *H01L 21/0228* (2013.01); *H01L 21/02211* (2013.01); *H01L 21/02274* (2013.01); *H01L 29/66795* (2013.01)

(58) Field of Classification Search
CPC ........... H01L 21/02252; H01L 21/0228; H01L 21/02296; H01L 21/0234; H01L 21/02326; H01L 21/3185; H01L 21/02208; H01L 21/0217; H01L 21/02211
USPC ...... 438/792, 485, 729; 257/E27.1, E29.117, 257/E29.137, E29.145, E29.147, E29.182, 257/E29.202, E29.273, E29.314, E29.32, 257/E21.411

See application file for complete search history.

(56) References Cited

U.S. PATENT DOCUMENTS

| | | | |
|---|---|---|---|
| 6,475,276 B1 | 11/2002 | Elers et al. | |
| 6,586,056 B2* | 7/2003 | Arkles et al. | 427/582 |
| 6,933,245 B2 | 8/2005 | Lee et al. | |
| 7,625,609 B2 | 12/2009 | Matsuura | |
| 7,651,955 B2 | 1/2010 | Ranish et al. | |
| 8,080,290 B2 | 12/2011 | Hasebe et al. | |
| 8,114,761 B2 | 2/2012 | Mandrekar et al. | |
| 8,119,544 B2 | 2/2012 | Hasebe et al. | |
| 8,242,031 B2* | 8/2012 | Mallick et al. | 438/787 |
| 8,329,599 B2 | 12/2012 | Fukazawa et al. | |
| 8,563,096 B2 | 10/2013 | Matsunaga et al. | |
| 8,580,664 B2 | 11/2013 | Clark | |
| 8,722,546 B2 | 5/2014 | Fukazawa et al. | |
| 2001/0012701 A1* | 8/2001 | Kang et al. | 438/791 |
| 2002/0061659 A1* | 5/2002 | Abe | 438/791 |
| 2002/0068466 A1 | 6/2002 | Lee et al. | |
| 2002/0119327 A1* | 8/2002 | Arkles | C23C 16/24 428/446 |
| 2002/0180028 A1* | 12/2002 | Borovik | C07F 7/006 257/700 |
| 2003/0097987 A1* | 5/2003 | Fukuda | C23C 16/4405 118/723 E |
| 2003/0215570 A1* | 11/2003 | Seutter et al. | 427/255.394 |
| 2003/0228770 A1* | 12/2003 | Lee et al. | 438/791 |
| 2004/0121085 A1* | 6/2004 | Wang et al. | 427/569 |
| 2004/0146644 A1 | 7/2004 | Xiao et al. | |
| 2005/0000430 A1* | 1/2005 | Jang | C23C 16/45565 118/715 |
| 2005/0025885 A1* | 2/2005 | McSwiney et al. | 427/248.1 |
| 2005/0145177 A1* | 7/2005 | McSwiney et al. | 118/723 MA |
| 2005/0159017 A1* | 7/2005 | Kim et al. | 438/791 |
| 2005/0181633 A1* | 8/2005 | Hochberg | C23C 16/24 438/787 |
| 2006/0019032 A1 | 1/2006 | Wang et al. | |
| 2006/0084283 A1* | 4/2006 | Paranjpe et al. | 438/791 |
| 2006/0148271 A1 | 7/2006 | Borovik et al. | |
| 2007/0116888 A1 | 5/2007 | Faguet | |
| 2007/0232071 A1* | 10/2007 | Balseanu et al. | 438/694 |
| 2007/0251444 A1 | 11/2007 | Gros-Jean et al. | |
| 2008/0020591 A1* | 1/2008 | Balseanu et al. | 438/761 |
| 2008/0242116 A1* | 10/2008 | Clark | C23C 16/345 438/791 |
| 2008/0274605 A1* | 11/2008 | Hoshi et al. | 438/585 |
| 2009/0155606 A1 | 6/2009 | Yoon et al. | |
| 2009/0163041 A1* | 6/2009 | Mungekar et al. | 438/792 |
| 2009/0263972 A1* | 10/2009 | Balseanu et al. | 438/696 |
| 2009/0311857 A1* | 12/2009 | Todd et al. | 438/591 |
| 2010/0041243 A1 | 2/2010 | Cheng et al. | |
| 2010/0124621 A1 | 5/2010 | Kobayashi et al. | |
| 2010/0304574 A1* | 12/2010 | Nodera et al. | 438/791 |
| 2011/0086516 A1* | 4/2011 | Lee et al. | 438/792 |
| 2011/0129990 A1 | 6/2011 | Mandrekar et al. | |
| 2011/0183528 A1 | 7/2011 | Wang et al. | |
| 2011/0256734 A1 | 10/2011 | Hausmann et al. | |
| 2012/0009802 A1* | 1/2012 | LaVoie et al. | 438/783 |
| 2012/0021127 A1* | 1/2012 | Sato | C07F 7/025 427/248.1 |
| 2012/0028469 A1 | 2/2012 | Onizawa et al. | |
| 2012/0077350 A1* | 3/2012 | Miya et al. | 438/765 |
| 2012/0164848 A1* | 6/2012 | Fujii | C23C 16/345 438/791 |
| 2012/0178264 A1 | 7/2012 | Murakami et al. | |
| 2012/0196048 A1 | 8/2012 | Ueda | |
| 2012/0196450 A1* | 8/2012 | Balseanu et al. | 438/786 |
| 2012/0213940 A1* | 8/2012 | Mallick | 427/535 |
| 2012/0220139 A1 | 8/2012 | Lee et al. | |
| 2013/0040447 A1* | 2/2013 | Swaminathan et al. | 438/558 |
| 2013/0078392 A1* | 3/2013 | Xiao | C07F 7/025 427/579 |
| 2013/0084714 A1 | 4/2013 | Oka et al. | |
| 2013/0115763 A1* | 5/2013 | Takamure et al. | 438/513 |
| 2013/0171839 A1 | 7/2013 | Nguyen et al. | |
| 2013/0175621 A1* | 7/2013 | Chen et al. | 257/347 |
| 2013/0330933 A1 | 12/2013 | Fukazawa et al. | |
| 2014/0023794 A1 | 1/2014 | Mahajani et al. | |
| 2014/0030444 A1 | 1/2014 | Swaminathan et al. | |
| 2014/0051263 A1 | 2/2014 | Tanaka et al. | |
| 2014/0073144 A1* | 3/2014 | Chatterjee et al. | 438/793 |
| 2014/0113457 A1* | 4/2014 | Sims | H01L 21/02167 438/792 |
| 2014/0124841 A1* | 5/2014 | Xie et al. | 257/288 |
| 2014/0193983 A1 | 7/2014 | LaVoie | |
| 2014/0227458 A1* | 8/2014 | Karakawa | C23C 16/34 427/569 |
| 2014/0273528 A1 | 9/2014 | Niskanen et al. | |
| 2014/0273529 A1 | 9/2014 | Nguyen et al. | |
| 2014/0273530 A1 | 9/2014 | Nguyen et al. | |
| 2014/0342573 A1 | 11/2014 | Hirose et al. | |
| 2014/0363980 A1 | 12/2014 | Kawamata et al. | |
| 2015/0031218 A1 | 1/2015 | Karakawa | |
| 2015/0104954 A1 | 4/2015 | Pore | |
| 2015/0104955 A1 | 4/2015 | Pore | |
| 2015/0162185 A1 | 6/2015 | Pore | |
| 2015/0206719 A1 | 7/2015 | Swaminathan et al. | |
| 2015/0287591 A1 | 10/2015 | Pore et al. | |

FOREIGN PATENT DOCUMENTS

WO  WO 2012144523 A1 * 10/2012 ............. C23C 16/34
WO  WO 2013/121936       8/2013

OTHER PUBLICATIONS

Office Action dated Jun. 5, 2014 in U.S. Appl. No. 14/062,328.
Office Action dated Jun. 17, 2014 in U.S. Appl. No. 14/167,904.
Keinan et al., "Diiodosilane. 3. Direct Synthesis of Acyl Iodides from Carboxylic Acids, Esters, Lactones, Acyl Chlorides, and Anhydrides," J. Org. Chem. (1990), 55, 3922-3926.
Keinan et al., "Diiodosilane. 2. A Multipurpose Reagent for Hyddrolysis and Reductive Iodination of Ketals, Acetals, Ketones, and Aldehydes," J. Org. Chem. (1990), 55, 2927-2938.
Keinan et al., "Diiodosilane. 1. A Novel Reagent for Deoxygenation of Alcohols and Ethers," J. Org. Chem. (1987), 52, 4846-4851.
Tamizhmani et al., "Physical Characterization of a-Si Thin Films Deposited by Thermal Decomposition of Iodosilanes," J. Phys. D: Appl. Phys. 24 (1991), 1015-1021.
Tamizhmani et al., "Some Physical Properties of Undoped Amorphous Silicon Prepared by a New Chemical Vapor Deposition Process Using Iodosilanes", Chem. Mater. (1990), 2, 473-476.
Office Action dated Oct. 6, 2015 in U.S. Appl. No. 14/167,904.
Cho, Namtae, "Processing of Boron Carbide," Ph.D. Thesis, School of Materials Science and Engineering, Georgia Institute of Technology, 2006, in 89 pages.
Domnich, et al., "Boron Carbide: Structures, Properties, and Stability under Stress," J. Am. Ceram. Soc., vol. 94, No. 11, 2011, pp. 3605-3628.

(56) References Cited

OTHER PUBLICATIONS

Knoops, Harm C.M. et al. "Plasma-assisted ALD of Silicon Nitride from BTBAS," 131h International Conference on Atomic Layer Deposition, Jul. 28-31, 2013, San Diego, California, U.S.A., 21 pages.

Pedersen, et al. "Low Temperature CVD of Thin, Amorphous Boron-Carbon Films for Neutron Detectors," 2012, Chemical Vapor Deposition, (18), 7-9, 221-224.

Sarubbi, et al., "Pure Boron-Doped Photodiodes: a Solution for Radiation Detection in EUV Lithography," ESSDERC 2008—38th European Solid-State Device Research Conference, 2008, pp. 278-281.

Triyoso et al., "Robust PEALD SiN spacer for gate first high-k metal gate integration", IEEE, 2012, 4 pages.

Final Office Action dated Feb. 24, 2015 in U.S. Appl. No. 14/167,904.

* cited by examiner

SI PRECURSORS FOR DEPOSITION OF SIN AT LOW TEMPERATURES

BACKGROUND OF THE INVENTION

Field of the Invention

The present disclosure relates generally to the field of semiconductor device manufacturing and, more particularly, to low temperature deposition of silicon nitride films and precursors for use in deposition of silicon nitride films.

Description of the Related Art

Spacers are widely used in semiconductor manufacturing as structures to protect against subsequent processing steps. For example, nitride spacers formed beside gate electrodes can be used as a mask to protect underlying source/drain areas during doping or implanting steps.

As the physical geometry of semiconductor devices shrinks, the gate electrode spacer becomes smaller and smaller. The spacer width is limited by the nitride thickness that can be deposited conformably over the dense gate electrodes lines. So the nitride spacer etching process is preferred to have a high ratio of spacer width to nitride layer thickness as deposited.

Current PEALD silicon nitride processes in general suffer from anisotropic etch behavior when deposited on a three-dimensional structure, such as a trench structure. In other words, the film deposited on the sidewalls of a trench or fin or another three dimensional feature display inferior film properties as compared to film on the top region of the feature. The film quality may be sufficient for the target application on the top of the trench, or on planar regions of a structured wafer, but not on the sidewalls or other non-horizontal or vertical surfaces.

FIGS. 1A and 1B illustrate a typical example of a silicon nitride film, which could be used in spacer applications. The film was deposited at 400° C. using a PEALD process other than those described in the present application. FIG. 1A illustrates the film after it was deposited on a three-dimensional surface but prior to being etched by HF. An etching process was then performed by dipping the workpiece in 0.5% HF for about 60 seconds. FIG. 1B illustrates the extent to which vertical portions of the silicon nitride film etch to a greater extent than the horizontal portions of the film. The film thicknesses are indicated in nanometers. Structures such as these would not generally survive further processing, such as in a FinFET spacer application.

SUMMARY OF THE INVENTION

In some aspects, atomic layer deposition (ALD) methods of forming silicon nitride films are provided. The ALD methods may be plasma enhanced ALD methods or thermal ALD methods. The methods allow for the deposition of silicon nitride films with desirable qualities, such as good step coverage and pattern loading effects, as well as desirable etch characteristics. According to some embodiments, the silicon nitride films have a relatively uniform etch rate for both the vertical and the horizontal portions, when deposited onto 3-dimensional structures. Such three-dimensional structures may include, for example and without limitation, FinFETS or other types of multiple gate FETs. In some embodiments, various silicon nitride films of the present disclosure have an etch rate of less than half the thermal oxide removal rate of about 2-3 nm per minute with diluted HF (0.5%).

In some embodiments, methods of depositing silicon nitride films on substrate in a reaction chamber comprise introducing a vapor phase silicon reactant to the reaction space such that the silicon precursor adsorbs on the substrate surface, removing excess silicon reactant, contacting the adsorbed silicon reactant with a reactive species generated by plasma from a nitrogen precursor, and removing excess reactive species and reaction by-products. These steps are repeated to achieve a silicon nitride film of the desired thickness.

In some embodiments, the silicon precursor comprises a precursor of formulas (1)-(8) as described herein. In some embodiments the silicon precursor is selected from the group consisting of $HSiI_3$, $H_2SiI_2$, $H_3SiI$, $H_2Si_2I_4$, $H_4Si_2I_2$, and $H_5Si_2I$. In some embodiments the silicon precursor is $H_2SiI_2$. The reactive species may comprise, for example, hydrogen, hydrogen atoms, hydrogen plasma, hydrogen radicals, $N^*$, $NH^*$ or $NH_2^*$ radicals.

In some embodiments the silicon nitride film is deposited on a three-dimensional structure. In some embodiments the silicon nitride film exhibits a step coverage and pattern loading effect of at least about 80%. In some embodiments the structure comprises a sidewall and top regions and the sidewall wet etch rate (WER) of the silicon nitride film relative to the top region WER is less than about 3 in 0.5% dHF. In some embodiments the etch rate of the silicon nitride film is less than about 0.4 nm/min in 0.5% aqueous HF.

In some embodiments, methods of depositing a silicon nitride film comprise loading a substrate comprising at least one three-dimensional feature into a reaction space, introducing a silicon precursor into the reaction space so that the silicon precursor is adsorbed on a surface of the substrate, purging the reaction space of excess silicon precursor, introducing a nitrogen precursor into the reaction space, purging the reaction space of excess nitrogen precursor, and repeating the steps to produce a film of the desired thickness. In some embodiments the film has a step coverage of more than about 50% on the three-dimensional feature. In some embodiments the wet etch rate of the silicon nitride film is less than about 5 nm/min in 5% aqueous HF. In some embodiments a ratio of an etch rate of the silicon nitride film in a sidewall of a three-dimensional structure to an etch rate on a top surface is less than about 4. In some embodiments the step coverage is at least about 80% or 90%.

In some embodiments, methods of depositing a silicon nitride film on a substrate comprise, exposing the substrate to a vapor phase silicon precursor so that the silicon precursor is adsorbed on a surface of the substrate, exposing the substrate to a purge gas and/or a vacuum to remove excess precursor and reaction byproducts from the substrate surface, contacting the adsorbed silicon precursor with species generated by a nitrogen plasma, exposing the substrate to a purge gas and/or a vacuum to remove the species of a nitrogen containing plasma and reaction byproducts from the substrate surface and from the proximity of the substrate surface, and repeating the steps to produce a film of the desired thickness.

In some embodiments, methods of depositing a silicon nitride film on a substrate comprise, exposing the substrate to a vapor phase silicon reactant so that the silicon reactant is adsorbed on a surface of the substrate, exposing the substrate to a purge gas and/or a vacuum to remove excess precursor and reaction byproducts from the substrate surface, contacting the adsorbed silicon reactant with a nitrogen precursor, exposing the substrate to a purge gas and/or a vacuum to remove excess nitrogen precursor and reaction byproducts from the substrate surface and from the proximity of the substrate surface, and repeating the steps to produce a film of the desired thickness.

In some embodiments the silicon precursor comprises iodine or bromine. In some embodiments the film has a step coverage of more than about 50%. In some embodiments the etch rate of the silicon nitride is less than about 5 nm/min in 0.5% aqueous HF. In some embodiments a ratio of an etch rate of the silicon nitride on a sidewall of a three-dimensional structure to an etch rate on a top surface of the three-dimensional structure is less than about 4.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF PREFERRED EMBODIMENTS

Figure 1A:
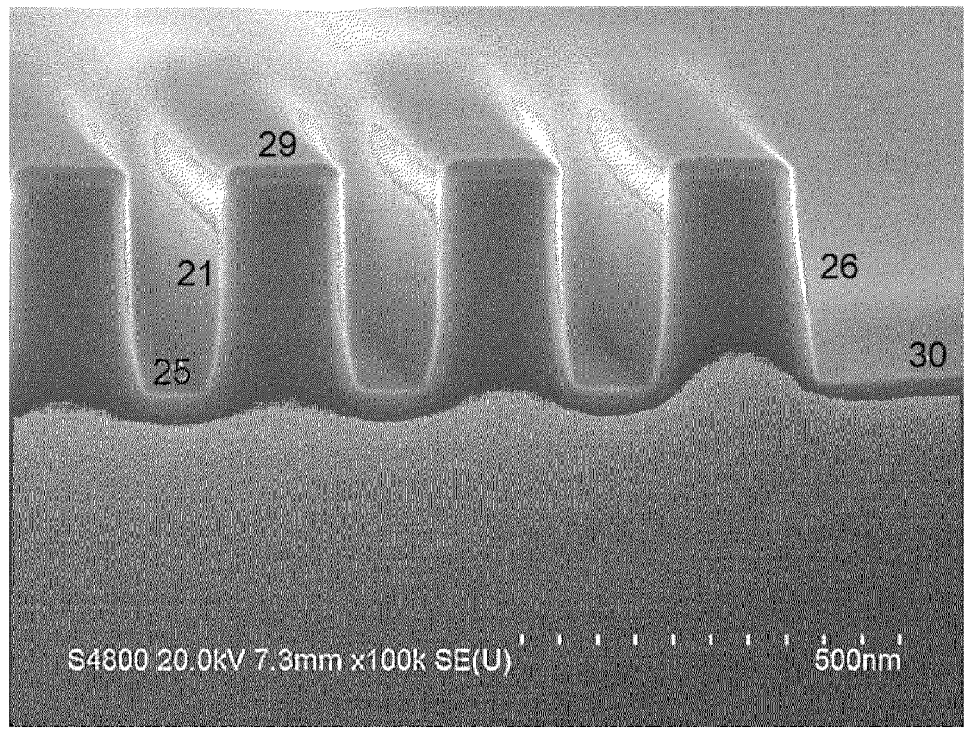
FIGS. 1A and 1B illustrate the results of an etching process on a silicon nitride film.
Figure 1B:
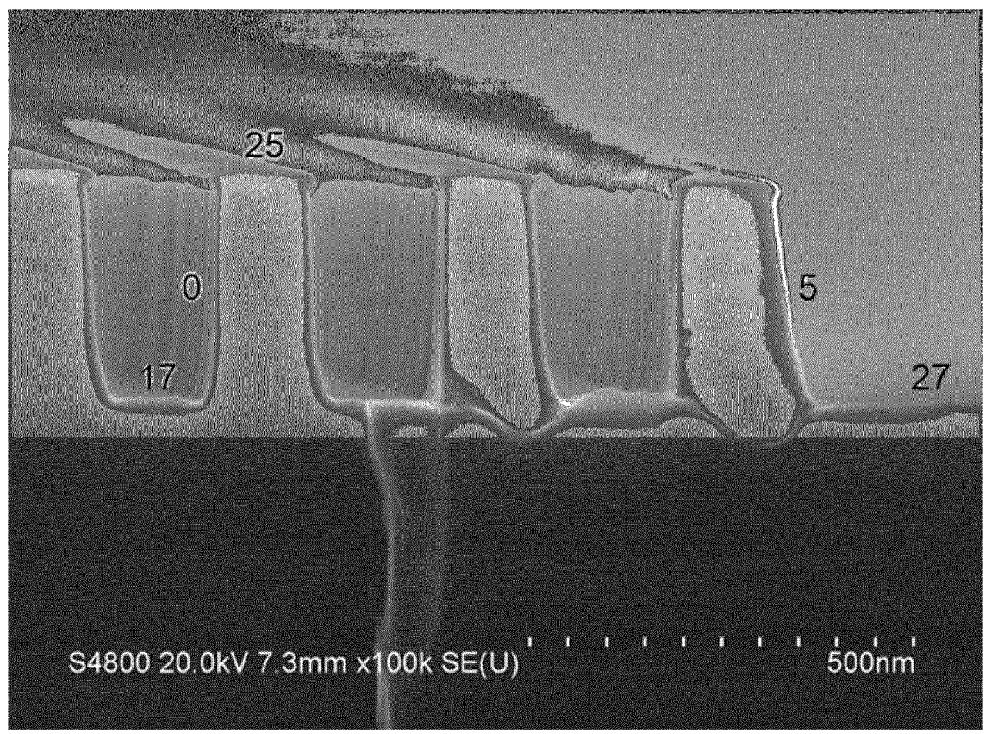

Silicon nitride films have a wide variety of applications, as will be apparent to the skilled artisan, such as in planar logic, DRAM, and NAND Flash devices. More specifically, conformal silicon nitride thin films that display uniform etch behavior have a wide variety of applications, both in the semiconductor industry and also outside of the semiconductor industry. According to some embodiments of the present disclosure, various silicon nitride films and precursors and methods for depositing those films by atomic layer deposition (ALD) are provided. Importantly, in some embodiments the silicon nitride films have a relatively uniform etch rate for both the vertical and the horizontal portions, when deposited onto 3-dimensional structures. Such three-dimensional structures may include, for example and without limitation, FinFETS or other types of multiple gate FETs. In some embodiments, various silicon nitride films of the present disclosure have an etch rate of less than half the thermal oxide removal rate of about 2-3 nm per minute with diluted HF (0.5%).

Thin film layers comprising silicon nitride can be deposited by plasma-enhanced atomic layer deposition (PEALD) type processes or by thermal ALD processes. In some embodiments, silicon nitride thin films are deposited on a substrate by PEALD. In some embodiments, silicon nitride thin films are deposited on a substrate by a thermal ALD process. In some embodiments a silicon nitride thin film is deposited over a three dimensional structure, such as a fin in the formation of a finFET device.

The formula of the silicon nitride is generally referred to herein as SiN for convenience and simplicity. However, the skilled artisan will understand that the actual formula of the silicon nitride, representing the Si:N ratio in the film and excluding hydrogen or other impurities, can be represented as $SiN_x$, where x varies from about 0.5 to about 2.0, as long as some Si—N bonds are formed. In some cases, x may vary from about 0.9 to about 1.7, from about 1.0 to about 1.5, or from about 1.2 to about 1.4. In some embodiments silicon nitride is formed where Si has an oxidation state of +IV and the amount of nitride in the material might vary.

ALD-type processes are based on controlled, generally self-limiting surface reactions. Gas phase reactions are typically avoided by contacting the substrate alternately and sequentially with the reactants. Vapor phase reactants are separated from each other in the reaction chamber, for example, by removing excess reactants and/or reactant byproducts between reactant pulses. The reactants may be removed from proximity with the substrate surface with the aid of a purge gas and/or vacuum. In some embodiments excess reactants and/or reactant byproducts are removed from the reaction space by purging, for example with an inert gas.

The methods presented herein provide for deposition of SiN thin films on substrate surfaces. Geometrically challenging applications are also possible due to the nature of ALD-type processes. According to some embodiments, ALD-type processes are used to form SiN thin films on substrates such as integrated circuit workpieces, and in some embodiments on three-dimensional structures on the substrates.

Figure 2:
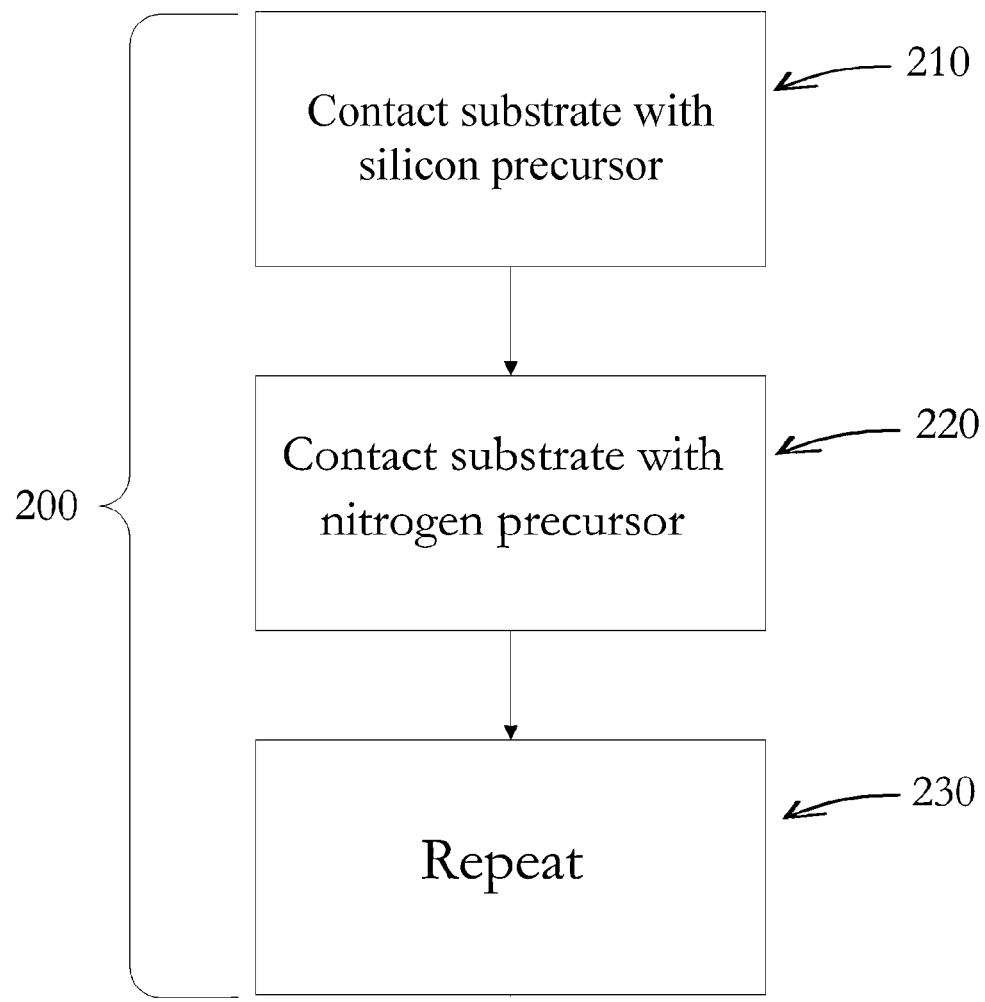
FIG. 2 is a flow chart generally illustrating a method of forming a silicon nitride film by an ALD process in accordance with some embodiments of the present disclosure.

FIG. 2 is a flow chart generally illustrating a silicon nitride ALD deposition cycle that can be used to deposit a silicon nitride thin film in accordance with some embodiments. According to certain embodiments, a silicon nitride thin film is formed on a substrate by an ALD-type process comprising multiple silicon nitride deposition cycles, each silicon nitride deposition cycle 200 comprising:

(1) contacting a substrate with a silicon precursor 210 such that the silicon precursor adsorbs on the substrate surface;

(2) contacting the substrate with a nitrogen precursor 220; and (3) repeating steps 210 and 220 as many times as required to achieve a thin film of a desired thickness and composition.

Excess reactants may be removed from the vicinity of the substrate, for example by purging from the reaction space with an inert gas, after each contacting step. The discussion below addresses each of these steps in greater detail.

PEALD Processes

In some embodiments, plasma enhanced ALD (PEALD) processes are used to deposit SiN films. Briefly, a substrate or workpiece is placed in a reaction chamber and subjected to alternately repeated surface reactions. In some embodiments, thin SiN films are formed by repetition of a self-limiting ALD cycle. Preferably, for forming SiN films, each ALD cycle comprises at least two distinct phases. The provision and removal of a reactant from the reaction space may be considered a phase. In a first phase, a first reactant comprising silicon is provided and forms no more than about one monolayer on the substrate surface. This reactant is also referred to herein as "the silicon precursor," "silicon-containing precursor," or "silicon reactant" and may be, for example, $H_2SiI_2$.

In a second phase, a second reactant comprising a reactive species is provided and may convert adsorbed silicon to silicon nitride. In some embodiments the second reactant comprises a nitrogen precursor. In some embodiments, the reactive species comprises an excited species. In some embodiments the second reactant comprises a species from a nitrogen containing plasma. In some embodiments, the second reactant comprises nitrogen radicals, nitrogen atoms and/or nitrogen plasma. The second reactant may comprise other species that are not nitrogen precursors. In some embodiments, the second reactant may comprise a plasma of hydrogen, radicals of hydrogen, or atomic hydrogen in one form or another. In some embodiments, the second reactant may comprise a species from a noble gas, such as He, Ne, Ar, Kr, or Xe, preferably Ar or He, for example as radicals, in plasma form, or in elemental form. These reactive species from noble gases do not necessarily contribute material to the deposited film, but can in some circumstances contribute to film growth as well as help in the formation and ignition of plasma. In some embodiments a gas that is used to form a plasma may flow constantly throughout the deposition process but only be activated intermittently.

Additional phases may be added and phases may be removed as desired to adjust the composition of the final film.

One or more of the reactants may be provided with the aid of a carrier gas, such as Ar or He. In some embodiments the silicon precursor and the second reactant are provided with the aid of a carrier gas.

In some embodiments, two of the phases may overlap, or be combined. For example, the silicon precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

As discussed in more detail below, in some embodiments for depositing a silicon nitride film, one or more deposition cycles begin with provision of the silicon precursor, followed by the second precursor. In other embodiments deposition may begin with provision of the second precursor, followed by the silicon precursor.

In some embodiments the substrate on which deposition is desired, such as a semiconductor workpiece, is loaded into a reactor. The reactor may be part of a cluster tool in which a variety of different processes in the formation of an integrated circuit are carried out. In some embodiments a flow-type reactor is utilized. In some embodiments a shower head type of reactor is utilized. In some embodiment, a space divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates is preferably in the range of 10 to 200, more preferably in the range of 50 to 150, and most preferably in the range of 100 to 130.

Exemplary single wafer reactors, designed specifically to enhance ALD processes, are commercially available from ASM America, Inc. (Phoenix, Ariz.) under the tradenames Pulsar® 2000 and Pulsar® 3000 and ASM Japan K.K (Tokyo, Japan) under the tradename Eagle® XP, XP8 and Dragon®. Exemplary batch ALD reactors, designed specifically to enhance ALD processes, are commercially available from and ASM Europe B.V (Almere, Netherlands) under the tradenames A400™ and A412™.

In some embodiments, if necessary, the exposed surfaces of the workpiece can be pretreated to provide reactive sites to react with the first phase of the ALD process. In some embodiments a separate pretreatment step is not required. In some embodiments the substrate is pretreated to provide a desired surface termination. In some embodiments the substrate is pretreated with plasma.

Excess reactant and reaction byproducts, if any, are removed from the vicinity of the substrate, and in particular from the substrate surface, between reactant pulses. In some embodiments the reaction chamber is purged between reactant pulses, such as by purging with an inert gas. The flow rate and time of each reactant, is tunable, as is the removal step, allowing for control of the quality and various properties of the films.

As mentioned above, in some embodiments a gas is provided to the reaction chamber continuously during each deposition cycle, or during the entire ALD process, and reactive species are provided by generating a plasma in the gas, either in the reaction chamber or upstream of the reaction chamber. In some embodiments the gas comprises nitrogen. In some embodiments the gas is nitrogen. In other embodiments the gas may comprise helium, or argon. In some embodiments the gas is helium or nitrogen. The flowing gas may also serve as a purge gas for the first and/or second reactant (or reactive species). For example, flowing nitrogen may serve as a purge gas for a first silicon precursor and also serve as a second reactant (as a source of reactive species). In some embodiments, nitrogen, argon, or helium may serve as a purge gas for a first precursor and a source of excited species for converting the silicon precursor to the silicon nitride film.

The cycle is repeated until a film of the desired thickness and composition is obtained. In some embodiments the deposition parameters, such as the flow rate, flow time, purge time, and/or reactants themselves, may be varied in one or more deposition cycles during the ALD process in order to obtain a film with the desired characteristics. In some embodiments, hydrogen and/or hydrogen plasma are not provided in a deposition cycle, or in the deposition process.

The term "pulse" may be understood to comprise feeding reactant into the reaction chamber for a predetermined amount of time. The term "pulse" does not restrict the length or duration of the pulse and a pulse can be any length of time.

In some embodiments, the silicon reactant is provided first. After an initial surface termination, if necessary or desired, a first silicon reactant pulse is supplied to the workpiece. In accordance with some embodiments, the first reactant pulse comprises a carrier gas flow and a volatile silicon species, such as $H_2SiI_2$, that is reactive with the workpiece surfaces of interest. Accordingly, the silicon reactant adsorbs upon these workpiece surfaces. The first reactant pulse self-saturates the workpiece surfaces such that any excess constituents of the first reactant pulse do not further react with the molecular layer formed by this process.

The first silicon reactant pulse is preferably supplied in gaseous form. The silicon precursor gas is considered "volatile" for purposes of the present description if the species exhibits sufficient vapor pressure under the process conditions to transport the species to the workpiece in sufficient concentration to saturate exposed surfaces.

In some embodiments the silicon reactant pulse is from about 0.05 seconds to about 5.0 seconds, about 0.1 seconds to about 3 seconds or about 0.2 seconds to about 1.0 seconds. The optimum pulsing time can be readily determined by the skilled artisan based on the particular circumstances.

After sufficient time for a molecular layer to adsorb on the substrate surface, excess first silicon reactant is then removed from the reaction space. In some embodiments the excess first reactant is purged by stopping the flow of the first chemistry while continuing to flow a carrier gas or purge gas for a sufficient time to diffuse or purge excess reactants and reactant by-products, if any, from the reaction space. In some embodiments the excess first precursor is purged with the aid of inert gas, such as nitrogen or argon, that is flowing throughout the ALD cycle.

In some embodiments, the first reactant is purged for about 0.1 seconds to about 10 seconds, about 0.3 seconds to about 5 seconds or about 0.3 seconds to about 1 second. Provision and removal of the silicon reactant can be considered the first or silicon phase of the ALD cycle.

In the second phase, a second reactant comprising a reactive species, such as nitrogen plasma is provided to the workpiece. Nitrogen, $N_2$, is flowed continuously to the reaction chamber during each ALD cycle in some embodiments. Nitrogen plasma may be formed by generating a plasma in nitrogen in the reaction chamber or upstream of the reaction chamber, for example by flowing the nitrogen through a remote plasma generator.

In some embodiments, plasma is generated in flowing $H_2$ and $N_2$ gases. In some embodiments the $H_2$ and $N_2$ are provided to the reaction chamber before the plasma is ignited or nitrogen and hydrogen atoms or radicals are formed. Without being bound to any theory, it is believed that the hydrogen may have a beneficial effect on the ligand removal step i.e. it may remove some of the remaining ligands or have other beneficial effects on the film quality. In some embodiments the $H_2$ and $N_2$ are provided to the reaction chamber continuously and nitrogen and hydrogen containing plasma, atoms or radicals is created or supplied when needed.

Typically, the second reactant, for example comprising nitrogen plasma, is provided for about 0.1 seconds to about 10 seconds. In some embodiments the second reactant, such as nitrogen plasma, is provided for about 0.1 seconds to about 10 seconds, 0.5 seconds to about 5 seconds or 0.5 seconds to about 2.0 seconds. However, depending on the reactor type, substrate type and its surface area, the second reactant pulsing time may be even higher than about 10 seconds. In some embodiments, pulsing times can be on the order of minutes. The optimum pulsing time can be readily determined by the skilled artisan based on the particular circumstances.

In some embodiments the second reactant is provided in two or more distinct pulses, without introducing another reactant in between any of the two or more pulses. For example, in some embodiments a nitrogen plasma is provided in two or more, preferably in two, sequential pulses, without introducing a Si-precursor in between the sequential pulses. In some embodiments during provision of nitrogen plasma two or more sequential plasma pulses are generated by providing a plasma discharge for a first period of time, extinguishing the plasma discharge for a second period of time, for example from about 0.1 seconds to about 10 seconds, from about 0.5 seconds to about 5 seconds or about 1.0 seconds to about 4.0 seconds, and exciting it again for a third period of time before introduction of another precursor or a removal step, such as before the Si-precursor or a purge step. Additional pulses of plasma can be introduced in the same way. In some embodiments a plasma is ignited for an equivalent period of time in each of the pulses.

Nitrogen plasma may be generated by applying RF power of from about 10 W to about 2000 W, preferably from about 50 W to about 1000 W, more preferably from about 100 W to about 500 W in some embodiments. In some embodiments the RF power density may be from about 0.02 $W/cm^2$ to about 2.0 $W/cm^2$, preferably from about 0.05 $W/cm^2$ to about 1.5 $W/cm^2$. The RF power may be applied to nitrogen that flows during the nitrogen plasma pulse time, that flows continuously through the reaction chamber, and/or that flows through a remote plasma generator. Thus in some embodiments the plasma is generated in situ, while in other embodiments the plasma is generated remotely.

After a time period sufficient to completely saturate and react the previously adsorbed molecular layer with the nitrogen plasma pulse, any excess reactant and reaction byproducts are removed from the reaction space. As with the removal of the first reactant, this step may comprise stopping the generation of reactive species and continuing to flow the inert gas, such as nitrogen or argon for a time period sufficient for excess reactive species and volatile reaction by-products to diffuse out of and be purged from the reaction space. In other embodiments a separate purge gas may be used. The purge may, in some embodiments, be from about 0.1 seconds to about 10 seconds, about 0.1 seconds to about 4 seconds or about 0.1 seconds to about 0.5 seconds. Together, the nitrogen plasma provision and removal represent a second, reactive species phase in a silicon nitride atomic layer deposition cycle.

The two phases together represent one ALD cycle, which is repeated to form silicon nitride thin films of a desired thickness. While the ALD cycle is generally referred to herein as beginning with the silicon phase, it is contemplated that in other embodiments the cycle may begin with the reactive species phase. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first ALD cycle, in subsequent cycles the reactive species phase will effectively follow the silicon phase. In some embodiments one or more different ALD cycles are provided in the deposition process.

According to some embodiments of the present disclosure, PEALD reactions may be performed at temperatures ranging from about 25° C. to about 700° C., preferably from about 50° C. to about 600° C., more preferably from about 100° C. to about 450° C., and most preferably from about 200° C. to about 400° C. In some embodiments, the optimum reactor temperature may be limited by the maximum allowed thermal budget. Therefore, in some embodiments the reaction temperature is from about 300° C. to about 400° C. In some applications, the maximum temperature is around about 400° C., and, therefore the PEALD process is run at that reaction temperature.

According to some embodiments of the present disclosure, the pressure of the reaction chamber during processing is maintained at from about 0.01 torr to about 50 torr, preferably from about 0.1 torr to about 10 torr.

Si Precursors

A number of suitable silicon precursors can be used in the presently disclosed PEALD processes. At least some of the suitable precursors may have the following general formula:

$$H_{2n+2-y-z}Si_nX_yA_z \quad (1)$$

wherein, n=1-10, y=1 or more (and up to 2n+2−z), z=0 or more (and up to 2n+2−y), X is I or Br, and A is a halogen other than X, preferably n=1-5 and more preferably n=1-3 and most preferably 1-2.

According to some embodiments, silicon precursors may comprise one or more cyclic compounds. Such precursors may have the following general formula:

$$H_{2n-y-z}Si_nX_yA_z \quad (2)$$

wherein the formula (2) compound is cyclic compound, n=3-10, y=1 or more (and up to 2n-z), z=0 or more (and up to 2n-y), X is I or Br, and A is a halogen other than X, preferably n=3-6.

According to some embodiments, silicon precursors may comprise one or more iodosilanes. Such precursors may have the following general formula:

$$H_{2n+2-y-z}Si_nI_yA_z \quad (3)$$

wherein, n=1-10, y=1 or more (and up to 2n+2-z), z=0 or more (and up to 2n+2-y), and A is a halogen other than I, preferably n=1-5 and more preferably n=1-3 and most preferably 1-2.

According to some embodiments, some silicon precursors may comprise one or more cyclic iodosilanes. Such precursors may have the following general formula:

$$H_{2n-y-z}Si_nI_yA_z \quad (4)$$

wherein the formula (4) compound is a cyclic compound, n=3-10, y=1 or more (and up to 2n-z), z=0 or more (and up to 2n-y), and A is a halogen other than I, preferably n=3-6.

According to some embodiments, some silicon precursors may comprise one or more bromosilanes. Such precursors may have the following general formula:

$$H_{2n+2-y-z}Si_nBr_yA_z \quad (5)$$

wherein, n=1-10, y=1 or more (and up to 2n+2-z), z=0 or more (and up to 2n+2-y), and A is a halogen other than Br, preferably n=1-5 and more preferably n=1-3 and most preferably 1-2.

According to some embodiments, some silicon precursors may comprise one or more cyclic bromosilanes. Such precursors may have the following general formula:

$$H_{2n-y-z}Si_nBr_yA_z \quad (6)$$

wherein the formula (6) compound is a cyclic compound, n=3-10, y=1 or more (and up to 2n-z), z=0 or more (and up to 2n-y), and A is a halogen other than Br, preferably n=3-6.

According to some embodiments, preferred silicon precursors comprise one or more iodosilanes. Such precursors may have the following general formula:

$$H_{2n+2-y}Si_nI_y \quad (7)$$

wherein, n=1-5, y=1 or more (up to 2n+2-y), preferably n=1-3 and more preferably n=1-2.

According to some embodiments, preferred silicon precursors comprise one or more bromosilanes. Such precursors may have the following general formula:

$$H_{2n+2-y}Si_nBr_y \quad (8)$$

wherein, n=1-5, y=1 or more (up to 2n+2-y), preferably n=1-3 and more preferably n=1-2.

According to some embodiments of a PEALD process, suitable silicon precursors can include at least compounds having any one of the general formulas (1) through (8). In general formulas (1) through (8), halides/halogens can include F, Cl, Br and I. In some embodiments, a silicon precursor comprises $SiI_4$, $HSiI_3$, $H_2SiI_2$, $H_3SiI$, $Si_2I_6$, $HSi_2I_5$, $H_2Si_2I_4$, $H_3Si_2I_3$, $H_4Si_2I_2$, $H_5Si_2I$, or $Si_3I_8$. In some embodiments, a silicon precursor comprises one of $HSiI_3$, $H_2SiI_2$, $H_3SiI$, $H_2Si_2I_4$, $H_4Si_2I_2$, and $H_5Si_2I$. In some embodiments the silicon precursor comprises two, three, four, five or six of $HSiI_3$, $H_2SiI_2$, $H_3SiI$, $H_2Si_2I_4$, $H_4Si_2I_2$, and $H_5Si_2I$, including any combinations thereof.

In certain embodiments, the Si precursor is $H_2SiI_2$.

In some embodiments, Si precursors of formulas (9)-(16), below, can be used in PEALD processes.

N Precursors

As discussed above, the second reactant in a PEALD process according to the present disclosure may comprise a nitrogen precursor, which may comprise a reactive species. Suitable plasma compositions include nitrogen plasma, radicals of nitrogen, or atomic nitrogen in one form or another. In some embodiments, hydrogen plasma, radicals of hydrogen, or atomic hydrogen in one form or another are also provided. And in some embodiments, a plasma may also contain noble gases, such as He, Ne, Ar, Kr and Xe, preferably Ar or He, in plasma form, as radicals, or in atomic form.

Thus, in some embodiments the second reactant may comprise plasma formed from compounds having both N and H, such as $NH_3$ and $N_2H_4$, a mixture of $N_2/H_2$ or other precursors having an N—H bond. In some embodiments the second reactant may be formed, at least in part, from $N_2$. In some embodiments the second reactant may be formed, at least in part, from $N_2$ and $H_2$, where the $N_2$ and $H_2$ are provided at a flow ratio ($N_2/H_2$) from about 20:1 to about 1:20, preferably from about 10:1 to about 1:10, more preferably from about 5:1 to about 1:5 and most preferably from about 1:2 to about 4:1, and in some cases 1:1.

The second reactant may be formed in some embodiments remotely via plasma discharge ("remote plasma") away from the substrate or reaction space. In some embodiments, the second reactant may be formed in the vicinity of the substrate or directly above substrate ("direct plasma").

Figure 3:
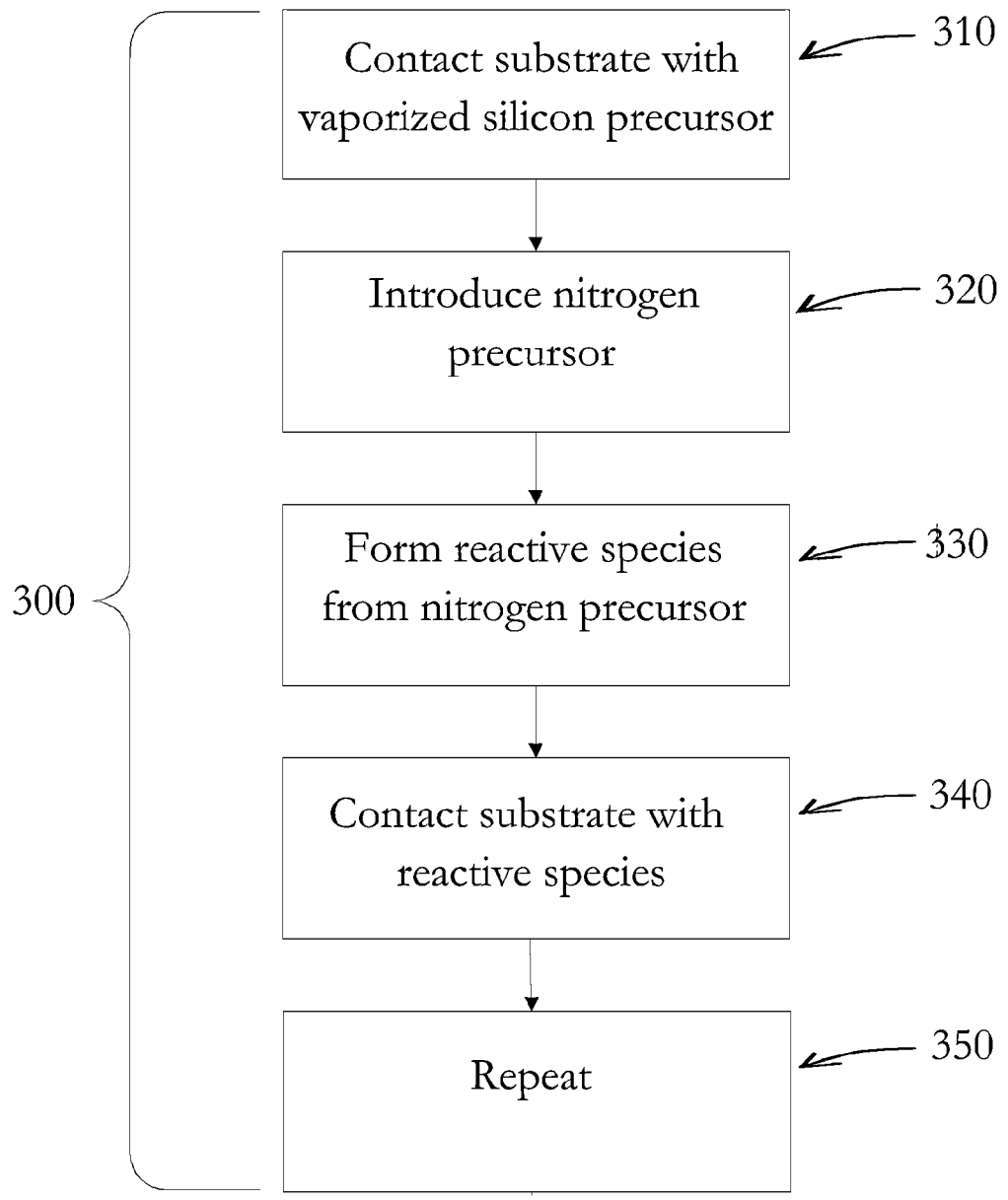
FIG. 3 is a flow chart illustrating a method of forming a silicon nitride thin film by a PEALD process in accordance with some embodiments of the present disclosure.

FIG. 3 is a flow chart generally illustrating a silicon nitride PEALD deposition cycle that can be used to deposit a silicon nitride thin film in accordance with some embodiments. According to certain embodiment, a silicon nitride thin film is formed on a substrate by a PEALD-type process comprising multiple silicon nitride deposition cycles, each silicon nitride deposition cycle 300 comprising:

(1) contacting a substrate with a vaporized silicon precursor 310 such that the silicon compound adsorbs on the substrate surface;

(2) introduction of a nitrogen precursor into a reaction space 320;

(3) generating a reactive species from a nitrogen precursor 330; and (4) contacting the substrate with the reactive species 340, thereby converting the adsorbed silicon compound into silicon nitride.

Nitrogen may flow continuously throughout the cycle, with nitrogen plasma formed at the appropriate times to convert adsorbed silicon compound into silicon nitride.

As mentioned above, in some embodiments the substrate may be contacted simultaneously with the silicon compound and the reactive species, while in other embodiments these reactants are provided separately.

The contacting steps are repeated 350 until a thin film of a desired thickness and composition is obtained. Excess reactants may be purged from the reaction space after each contacting step, i.e., steps 310 and 340.

According to some embodiments, a silicon nitride thin film is deposited using a PEALD process on a substrate having three-dimensional features, such as in a FinFET application. The process may comprise the following steps:

(1) a substrate comprising a three-dimensional structure is provided in a reaction space;

(2) a silicon-containing precursor, such as $SiI_2H_2$, is introduced into the reaction space so that the silicon-containing precursor is adsorbed to a surface of the substrate;

(3) excess silicon-containing precursor and reaction byproducts are removed from the reaction space;

(4) a nitrogen-containing precursor, such as $N_2$, $NH_3$, $N_2H_4$, or $N_2$ and $H_2$, is introduced into the reaction space;

(5) generating reactive species from the nitrogen precursor;

(6) contacting the substrate with the reactive species; and (7) removing excess nitrogen atoms, plasma, or radicals and reaction byproducts;

Steps (2) through (7) may be repeated until a silicon nitride film of a desired thickness is formed.

In some embodiments steps (5) and (6) are replaced by a step in which the nitrogen atoms, plasma or radicals are formed remotely and provided to the reaction space.

In some embodiments, the PEALD process is performed at a temperature between about 200° C. to about 400° C., between about 300° C. and about 400° C., or at about 400° C.

Thermal ALD Processes

The methods presented herein also allow deposition of silicon nitride films on substrate surfaces by thermal ALD processes. Geometrically challenging applications, such as 3-dimensional structures, are also possible with these thermal processes. According to some embodiments, thermal atomic layer deposition (ALD) type processes are used to form silicon nitride films on substrates such as integrated circuit workpieces.

A substrate or workpiece is placed in a reaction chamber and subjected to alternately repeated, self-limiting surface reactions. Preferably, for forming silicon nitride films each thermal ALD cycle comprises at least two distinct phases. The provision and removal of a reactant from the reaction space may be considered a phase. In a first phase, a first reactant comprising silicon is provided and forms no more than about one monolayer on the substrate surface. This reactant is also referred to herein as "the silicon precursor" or "silicon reactant" and may be, for example, $H_2SiI_2$. In a second phase, a second reactant comprising a nitrogen-containing compound is provided and reacts with the adsorbed silicon precursor to form SiN. This second reactant may also be referred to as a "nitrogen precursor" or "nitrogen reactant." The second reactant may comprise $NH_3$ or another suitable nitrogen-containing compound. Additional phases may be added and phases may be removed as desired to adjust the composition of the final film.

One or more of the reactants may be provided with the aid of a carrier gas, such as Ar or He. In some embodiments the silicon precursor and the nitrogen precursor are provided with the aid of a carrier gas.

In some embodiments, two of the phases may overlap, or be combined. For example, the silicon precursor and the nitrogen precursor may be provided simultaneously in pulses that partially or completely overlap. In addition, although referred to as the first and second phases, and the first and second reactants, the order of the phases and the order of provision of reactants may be varied, and an ALD cycle may begin with any one of the phases or any of the reactants. That is, unless specified otherwise, the reactants can be provided in any order and the process may begin with any of the reactants.

As discussed in more detail below, in some embodiments for depositing a silicon nitride film, one or more deposition cycles typically begins with provision of the silicon precursor followed by the nitrogen precursor. In some embodiments, one or more deposition cycles begins with provision of the nitrogen precursor followed by the silicon precursor.

Again, one or more of the reactants may be provided with the aid of a carrier gas, such as Ar or He. In some embodiments the nitrogen precursor is provided with the aid of a carrier gas. In some embodiments, although referred to as a first phase and a second phase and a first and second reactant, the order of the phases and thus the order of provision of the reactants may be varied, and an ALD cycle may begin with any one of the phases.

In some embodiments the substrate on which deposition is desired, such as a semiconductor workpiece, is loaded into a reactor. The reactor may be part of a cluster tool in which a variety of different processes in the formation of an integrated circuit are carried out. In some embodiments a flow-type reactor is utilized. In some embodiments a shower head type of reactor is utilized. In some embodiments a space divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates is preferably in the range of 10 to 200, more preferably in the range of 50 to 150, and most preferably in the range of 100 to 130.

Exemplary single wafer reactors, designed specifically to enhance ALD processes, are commercially available from ASM America, Inc. (Phoenix, Ariz.) under the tradenames Pulsar® 2000 and Pulsar® 3000 and ASM Japan K.K (Tokyo, Japan) under the tradename Eagle® XP, XP8 and Dragon®. Exemplary batch ALD reactors, designed specifically to enhance ALD processes, are commercially available from and ASM Europe B.V (Almere, Netherlands) under the tradenames A400™ and A412™.

In some embodiments, if necessary, the exposed surfaces of the workpiece can be pretreated to provide reactive sites to react with the first phase of the ALD process. In some embodiments a separate pretreatment step is not required. In some embodiments the substrate is pretreated to provide a desired surface termination.

In some embodiments, excess reactant and reaction byproducts, if any, are removed from the vicinity of the precursor, such as from the substrate surface, between reactant pulses. In some embodiments excess reactant and reaction byproducts are removed from the reaction chamber by purging between reactant pulses, for example with an inert gas. The flow rate and time of each reactant, is tunable, as is the purge step, allowing for control of the quality and properties of the films. In some embodiments removing excess reactant and/or reaction byproducts comprises moving the substrate.

As mentioned above, in some embodiments, a gas is provided to the reaction chamber continuously during each deposition cycle, or during the entire ALD process. In other embodiments the gas may be nitrogen, helium or argon.

The ALD cycle is repeated until a film of the desired thickness and composition is obtained. In some embodiments the deposition parameters, such as the flow rate, flow time, purge time, and/or precursors themselves, may be varied in one or more deposition cycles during the ALD process in order to obtain a film with the desired characteristics.

The term "pulse" may be understood to comprise feeding reactant into the reaction chamber for a predetermined amount of time. The term "pulse" does not restrict the length or duration of the pulse and a pulse can be any length of time.

In some embodiments, the silicon precursor is provided first. After an initial surface termination, if necessary or desired, a first silicon precursor pulse is supplied to the workpiece. In accordance with some embodiments, the first precursor pulse comprises a carrier gas flow and a volatile silicon species, such as $H_2SiI_2$, that is reactive with the workpiece surfaces of interest. Accordingly, the silicon precursor adsorbs upon the workpiece surfaces. The first precursor pulse self-saturates the workpiece surfaces such that any excess constituents of the first precursor pulse do not substantially react further with the molecular layer formed by this process.

The first silicon precursor pulse is preferably supplied in gaseous form. The silicon precursor gas is considered "volatile" for purposes of the present description if the species exhibits sufficient vapor pressure under the process conditions to transport the species to the workpiece in sufficient concentration to saturate exposed surfaces.

In some embodiments the silicon precursor pulse is from about 0.05 seconds to about 5.0 seconds, about 0.1 seconds to about 3 seconds or about 0.2 seconds to about 1.0 second. In batch process the silicon precursor pulses can be substantially longer as can be determined by the skilled artisan given the particular circumstances.

After sufficient time for a molecular layer to adsorb on the substrate surface, excess first precursor is then removed from the reaction space. In some embodiments the excess first precursor is purged by stopping the flow of the first precursor while continuing to flow a carrier gas or purge gas for a sufficient time to diffuse or purge excess reactants and reactant by-products, if any, from the reaction space.

In some embodiments, the first precursor is purged for about 0.1 seconds to about 10 seconds, about 0.3 seconds to about 5 seconds or about 0.3 seconds to about 1 seconds. Provision and removal of the silicon precursor can be considered the first or silicon phase of the ALD cycle. In batch process the first precursor purge can be substantially longer as can be determined by the skilled artisan given the specific circumstances.

A second, nitrogen precursor is pulsed into the reaction space to contact the substrate surface. The nitrogen precursor may be provided with the aid of a carrier gas. The nitrogen precursor may be, for example, $NH_3$ or $N_2H_4$. The nitrogen precursor pulse is also preferably supplied in gaseous form. The nitrogen precursor is considered "volatile" for purposes of the present description if the species exhibits sufficient vapor pressure under the process conditions to transport the species to the workpiece in sufficient concentration to saturate exposed surfaces.

In some embodiments, the nitrogen precursor pulse is about 0.05 seconds to about 5.0 seconds, 0.1 seconds to about 3.0 seconds or about 0.2 seconds to about 1.0 second. In batch process the nitrogen precursor pulses can be substantially longer as can be determined by the skilled artisan given the specific circumstances.

After sufficient time for a molecular layer to adsorb on the substrate surface at the available binding sites, the second, nitrogen precursor is then removed from the reaction space. In some embodiments the flow of the second nitrogen precursor is stopped while continuing to flow a carrier gas for a sufficient time to diffuse or purge excess reactants and reactant by-products, if any, from the reaction space, preferably with greater than about two reaction chamber volumes of the purge gas, more preferably with greater than about three chamber volumes. Provision and removal of the nitrogen precursor can be considered the second or nitrogen phase of the ALD cycle.

In some embodiments, the nitrogen precursor is purged for about 0.1 seconds to about 10.0 seconds, about 0.3 seconds to about 5.0 seconds or about 0.3 seconds to about 1.0 second. In batch process the first precursor purge can be substantially longer as can be determined by the skilled artisan given the specific circumstances.

The flow rate and time of the nitrogen precursor pulse, as well as the removal or purge step of the nitrogen phase, are tunable to achieve a desired composition in the silicon nitride film. Although the adsorption of the nitrogen precursor on the substrate surface is typically self-limiting, due to the limited number of binding sites, pulsing parameters can be adjusted such that less than a monolayer of nitrogen is adsorbed in one or more cycles.

The two phases together represent one ALD cycle, which is repeated to form silicon nitrogen thin films of the desired thickness. While the ALD cycle is generally referred to herein as beginning with the silicon phase, it is contemplated that in other embodiments the cycle may begin with the nitrogen phase. One of skill in the art will recognize that the first precursor phase generally reacts with the termination left by the last phase in the previous cycle. In some embodiments one or more different ALD cycles are provided in the deposition process.

According to some embodiments of the present disclosure, ALD reactions may be performed at temperatures ranging from about 25° C. to about 1000° C., preferably from about 100° C. to about 800° C., more preferably from about 200° C. to about 650° C., and most preferably from about 300° C. to about 500° C. In some embodiments, the optimum reactor temperature may be limited by the maximum allowed thermal budget. Therefore, the reaction temperature can be from about 300° C. to about 400° C. In some applications, the maximum temperature is around about 400° C., and, therefore, the process is run at that reaction temperature.

Si Precursors

A number of suitable silicon precursors may be used in the presently disclosed thermal. In some embodiments these precursors may also be used in plasma ALD processes in which a film with a desired quality (at least one of the desired WER, WERR, pattern loading effect or/and step coverage features described below) is deposited.

According to some embodiments, some silicon precursors comprise iodine and the film deposited by using that precursor has at least one desired property, for example at least one of the desired WER, WERR, pattern loading effect or/and step coverage features described below.

According to some embodiments, some silicon precursors comprise bromine and the film deposited by using that precursor have at least one desired property, for example at least one of the desired WER, WERR, pattern loading effect or/and step coverage features described below.

At least some of the suitable precursors may have the following general formula:

$$H_{2n+2-y-z-w}Si_nX_yA_zR_w \qquad (9)$$

wherein, n=1-10, y=1 or more (and up to 2n+2-z-w), z=0 or more (and up to 2n+2-y-w), w=0 or more (and up to 2n+2-y-z), X is I or Br, A is a halogen other than X, R is an organic ligand and can be independently selected from the group consisting of alkoxides, alkylsilyls, alkyl, substituted alkyl, alkylamines and unsaturated hydrocarbon; preferably n=1-5 and more preferably n=1-3 and most preferably 1-2. Preferably R is a $C_1$-$C_3$ alkyl ligand, such as methyl, ethyl, n-propyl or isopropyl.

According to some embodiments, some silicon precursors comprise one or more cyclic compounds. Such precursors may have the following general formula:

$$H_{2n-y-z-w}Si_nX_yA_zR_w \quad (10)$$

wherein, n=3-10, y=1 or more (and up to 2n−z−w), z=0 or more (and up to 2n−y−w), w=0 or more (and up to 2n−y−z), X is I or Br, A is a halogen other than X, R is an organic ligand and can be independently selected from the group consisting of alkoxides, alkylsilyls, alkyl, substituted alkyl, alkylamines and unsaturated hydrocarbon; preferably n=3-6. Preferably R is a $C_1$-$C_3$ alkyl ligand, such as methyl, ethyl, n-propyl or isopropyl.

According to some embodiments, some silicon precursors comprise one or more iodosilanes. Such precursors may have the following general formula:

$$H_{2n+2-y-z-w}Si_nI_yA_zR_w \quad (11)$$

wherein, n=1-10, y=1 or more (and up to 2n+2−z−w), z=0 or more (and up to 2n+2−y−w), w=0 or more (and up to 2n+2−y−z), A is a halogen other than I, R is an organic ligand and can be independently selected from the group consisting of alkoxides, alkylsilyls, alkyl, substituted alkyl, alkylamines and unsaturated hydrocarbon; preferably n=1-5 and more preferably n=1-3 and most preferably 1-2. Preferably R is a $C_1$-$C_3$ alkyl ligand, such as methyl, ethyl, n-propyl or isopropyl.

According to some embodiments, some silicon precursors comprise one or more cyclic iodosilanes. Such precursors may have the following general formula:

$$H_{2n-y-z-w}Si_nI_yA_zR_w \quad (12)$$

wherein, n=3-10, y=1 or more (and up to 2n−z−w), z=0 or more (and up to 2n−y−w), w=0 or more (and up to 2n−y−z), A is a halogen other than I, R is an organic ligand and can be independently selected from the group consisting of alkoxides, alkylsilyls, alkyl, substituted alkyl, alkylamines and unsaturated hydrocarbon; preferably n=3-6. Preferably R is a $C_1$-$C_3$ alkyl ligand, such as methyl, ethyl, n-propyl or isopropyl.

According to some embodiments, some silicon precursors comprise one or more bromosilanes. Such precursors may have the following general formula:

$$H_{2n+2-y-z-w}Si_nBr_yA_zR_w \quad (13)$$

wherein, n=1-10, y=1 or more (and up to 2n+2−z−w), z=0 or more (and up to 2n+2−y−w), w=0 or more (and up to 2n+2−y−z), A is a halogen other than Br, R is an organic ligand and can be independently selected from the group consisting of alkoxides, alkylsilyls, alkyl, substituted alkyl, alkylamines and unsaturated hydrocarbon; preferably n=1-5 and more preferably n=1-3 and most preferably 1-2. Preferably R is a $C_1$-$C_3$ alkyl ligand, such as methyl, ethyl, n-propyl or isopropyl.

According to some embodiments, some silicon precursors comprise one or more cyclic bromosilanes. Such precursors may have the following general formula:

$$H_{2n-y-z-w}Si_nBr_yA_zR_w \quad (14)$$

wherein, n=3-10, y=1 or more (and up to 2n−z−w), z=0 or more (and up to 2n−y−w), w=0 or more (and up to 2n−y−z), A is a halogen other than Br, R is an organic ligand and can be independently selected from the group consisting of alkoxides, alkylsilyls, alkyl, substituted alkyl, alkylamines and unsaturated hydrocarbon; preferably n=3-6. Preferably R is a $C_1$-$C_3$ alkyl ligand such as methyl, ethyl, n-propyl or isopropyl.

According to some embodiment, some silicon precursors comprise one or more iodosilanes or bromosilanes in which the iodine or bromine is not bonded to the silicon in the compound. Accordingly some suitable compounds may have iodine/bromine substituted alkyl groups. Such precursors may have the following general formula:

$$H_{2n+2-y-z-w}Si_nX_yA_zR''_w \quad (15)$$

wherein, n=1-10, y=0 or more (and up to 2n+2−z−w), z=0 or more (and up to 2n+2−y−w), w=1 or more (and up to 2n+2−y−z), X is I or Br, A is a halogen other than X, R'' is an organic ligand containing I or Br and can be independently selected from the group consisting of I or Br substituted alkoxides, alkylsilyls, alkyls, alkylamines and unsaturated hydrocarbons; preferably n=1-5 and more preferably n=1-3 and most preferably 1-2. Preferably R'' is an iodine substituted $C_1$-$C_3$ alkyl ligand.

According to some embodiment, some silicon precursors comprise one or more cyclic iodosilanes or bromosilanes. Accordingly some suitable cyclic compounds may have iodine/bromine substituted alkyl groups. Such precursors may have the following general formula:

$$H_{2n-y-z-w}Si_nX_yA_zR''_w \quad (16)$$

wherein, n=3-10, y=0 or more (and up to 2n+2−z−w), z=0 or more (and up to 2n+2−y−w), w=1 or more (and up to 2n+2−y−z), X is I or Br, A is a halogen other than X, R'' is an organic ligand containing I or Br and can be independently selected from the group consisting of I or Br substituted alkoxides, alkylsilyls, alkyls, alkylamines and unsaturated hydrocarbons; preferably n=3-6. Preferably R is an iodine substituted $C_1$-$C_3$ alkyl ligand.

According to some embodiments of a thermal ALD process, suitable silicon precursors can include at least compounds having any one of the general formulas (9) through (16). In general formulas (9) through (16), halides/halogens can include F, Cl, Br and I.

In some embodiments, a silicon precursor comprises one or more of the following: $SiI_4$, $HSiI_3$, $H_2SiI_2$, $H_3SiI$, $Si_2I_6$, $HSi_2I_5$, $H_2Si_2I_4$, $H_3Si_2I_3$, $H_4Si_2I_2$, $H_5Si_2I$, $Si_3I_8$, $HSi_2I_5$, $H_2Si_2I_4$, $H_3Si_2I_3$, $H_4Si_2I_2$, $H_5Si_2I$, $MeSiI_3$, $Me_2SiI_2$, $Me_3SiI$, $MeSi_2I_5$, $Me_2Si_2I_4$, $Me_3Si_2I_3$, $Me_4Si_2I_2$, $Me_5Si_2I$, $HMeSiI_2$, $HMe_2SiI$, $HMeSi_2I_4$, $HMe_2Si_2I_3$, $HMe_3Si_2I_2$, $HMe_4Si_2I$, $H_2MeSiI$, $H_2MeSi_2I_3$, $H_2Me_2Si_2I_2$, $H_2Me_3Si_2I$, $H_3MeSi_2I_2$, $H_3Me_2Si_2I$, $H_4MeSi_2I$, $EtSiI_3$, $Et_2SiI_2$, $Et_3SiI$, $EtSi_2I_5$, $Et_2Si_2I_4$, $Et_3Si_2I_3$, $Et_4Si_2I_2$, $Et_5Si_2I$, $HEtSiI_2$, $HEt_2SiI$, $HEtSi_2I_4$, $HEt_2Si_2I_3$, $HEt_3Si_2I_2$, $HEt_4Si_2I$, $H_2EtSiI$, $H_2EtSi_2I_3$, $H_2Et_2Si_2I_2$, $H_2Et_3SiI_2I$, $H_3EtSi_2I_2$, $H_3Et_2Si_2I$, and $H_4EtSi_2I$.

In some embodiments, a silicon precursor comprises one or more of the following: $EtMeSiI_2$, $Et_2MeSiI$, $EtMe_2SiI$, $EtMeSi_2I_4$, $Et_2MeSi_2I_3$, $EtMe_2Si_2I_3$, $Et_3MeSi_2I_2$, $Et_2Me_2Si_2I_2$, $EtMe_3Si_2I_2$, $Et_4Me_2Si_2I$, $Et_3Me_2Si_2I$, $Et_2Me_3Si_2I$, $EtMe_4Si_2I$, $HEtMeSiI$, $HEtMeSi_2I_3$, $HEt_2MeSi_2I_2$, $HEtMe_2Si_2I_2$, $HEt_3MeSi_2I$, $HEt_2Me_2Si_2I$, $HEtMe_3Si_2I$, $H_2EtMeSi_2I_2$, $H_2Et_2MeSi_2I$, $H_2EtMe_2Si_2I$, $H_3EtMeSi_2I$.

In some embodiments, a silicon precursor comprises one or more of the following: $HSiI_3$, $H_2SiI_2$, $H_3SiI$, $H_2Si_2I_4$, $H_4Si_2I_2$, $H_5Si_2I$, $MeSiI_3$, $Me_2SiI_2$, $Me_3SiI$, $Me_2Si_2I_4$, $Me_4Si_2I_2$, $HMeSiI_2$, $H_2Me_2Si_2I_2$, $EtSiI_3$, $Et_2SiI_2$, $Et_3SiI$, $Et_2Si_2I_4$, $Et_4Si_2I_2$, and $HEtSiI_2$. In some embodiments a silicon precursor comprises two, three, four, five, six, seven, eight, nine, ten, eleven, twelve, thirteen, fourteen, fifteen, sixteen, seventeen, eighteen, nineteen or more compounds selected from $HSiI_3$, $H_2SiI_2$, $H_3SiI$, $H_2Si_2I_4$, $H_4Si_2I_2$, $H_5Si_2I$, $MeSiI_3$, $Me_2SiI_2$, $Me_3SiI$, $Me_2Si_2I_4$, $Me_4Si_2I_2$, $HMeSiI_2$, $H_2Me_2Si_2I_2$, $EtSiI_3$, $Et_2SiI_2$, $Et_3SiI$, $Et_2Si_2I_4$, $Et_4Si_2I_2$, and $HEtSiI_2$, including any combinations thereof. In certain embodiments, the silicon precursor is $H_2SiI_2$.

Other Types of Si-Precursors Containing I or Br

A number of suitable silicon precursors containing nitrogen, such as iodine or bromine substituted silazanes, or sulphur, may be used in the presently disclosed thermal and plasma ALD processes. In some embodiments silicon precursors containing nitrogen, such as iodine or bromine substituted silazanes, may be used in the presently disclosed thermal and plasma ALD processes in which a film with desired quality is to be deposited, for example at least one of the desired WER, WERR, pattern loading effect or/and step coverage features described below.

At least some of the suitable iodine or bromine substituted silicon precursors may have the following general formula:

$$H_{2n+2-y-z-w}Si_n(EH)_{n-1}X_yA_zR_w \quad (17)$$

wherein, n=2-10, y=1 or more (and up to 2n+2−z−w), z=0 or more (and up to 2n+2−y−w), w=0 or more (and up to 2n+2−y−z), X is I or Br, E is N or S, preferably N, A is a halogen other than X, R is an organic ligand and can be independently selected from the group consisting of alkoxides, alkylsilyls, alkyl, substituted alkyl, alkylamines and unsaturated hydrocarbon; preferably n=2-5 and more preferably n=2-3 and most preferably 1-2. Preferably R is a $C_1$-$C_3$ alkyl ligand, such as methyl, ethyl, n-propyl or isopropyl.

At least some of the suitable iodine or bromine substituted silazane precursors may have the following general formula:

$$H_{2n+2-y-z-w}Si_n(NH)_{n-1}X_yA_zR_w \quad (18)$$

wherein, n=2-10, y=1 or more (and up to 2n+2−z−w), z=0 or more (and up to 2n+2−y−w), w=0 or more (and up to 2n+2−y−z), X is I or Br, A is a halogen other than X, R is an organic ligand and can be independently selected from the group consisting of alkoxides, alkylsilyls, alkyl, substituted alkyl, alkylamines and unsaturated hydrocarbon; preferably n=2-5 and more preferably n=2-3 and most preferably 2. Preferably R is a $C_1$-$C_3$ alkyl ligand, such as methyl, ethyl, n-propyl or isopropyl.

In some embodiments, the silicon precursor comprises Si-compound, such as heterocyclic Si compound, which comprises I or Br. Such cyclic precursors may comprise the following substructure:

$$\text{—Si-E-Si—} \quad (19)$$

wherein E is N or S, preferably N.

In some embodiments the silicon precursor comprises substructure according to formula (19) and example of this kind of compounds is for example, iodine or bromine substituted cyclosilazanes, such iodine or bromine substituted cyclotrisilazane.

In some embodiments, the silicon precursor comprises Si-compound, such as silylamine based compound, which comprises I or Br. Such silylamine based Si-precursors may have the following general formula:

$$(H_{3-y-z-w}X_yA_zR_wSi)_3\text{—N} \quad (20)$$

wherein, y=1 or more (and up to 3−z−w), z=0 or more (and up to 3−y−w), w=0 or more (and up to 3−y−z), X is I or Br, A is a halogen other than X, R is an organic ligand and can be independently selected from the group consisting of alkoxides, alkylsilyls, alkyl, substituted alkyl, alkylamines and unsaturated hydrocarbon. Preferably R is a $C_1$-$C_3$ alkyl ligand, such as methyl, ethyl, n-propyl or isopropyl. Each of the three $H_{3-y-z-w}X_yA_zR_wSi$ ligands can be independently selected from each other.

N Precursors

According to some embodiments, the second reactant or nitrogen precursor in a thermal ALD process may be $NH_3$, $N_2H_4$, or any number of other suitable nitrogen compounds having a N—H bond.

Figure 4:
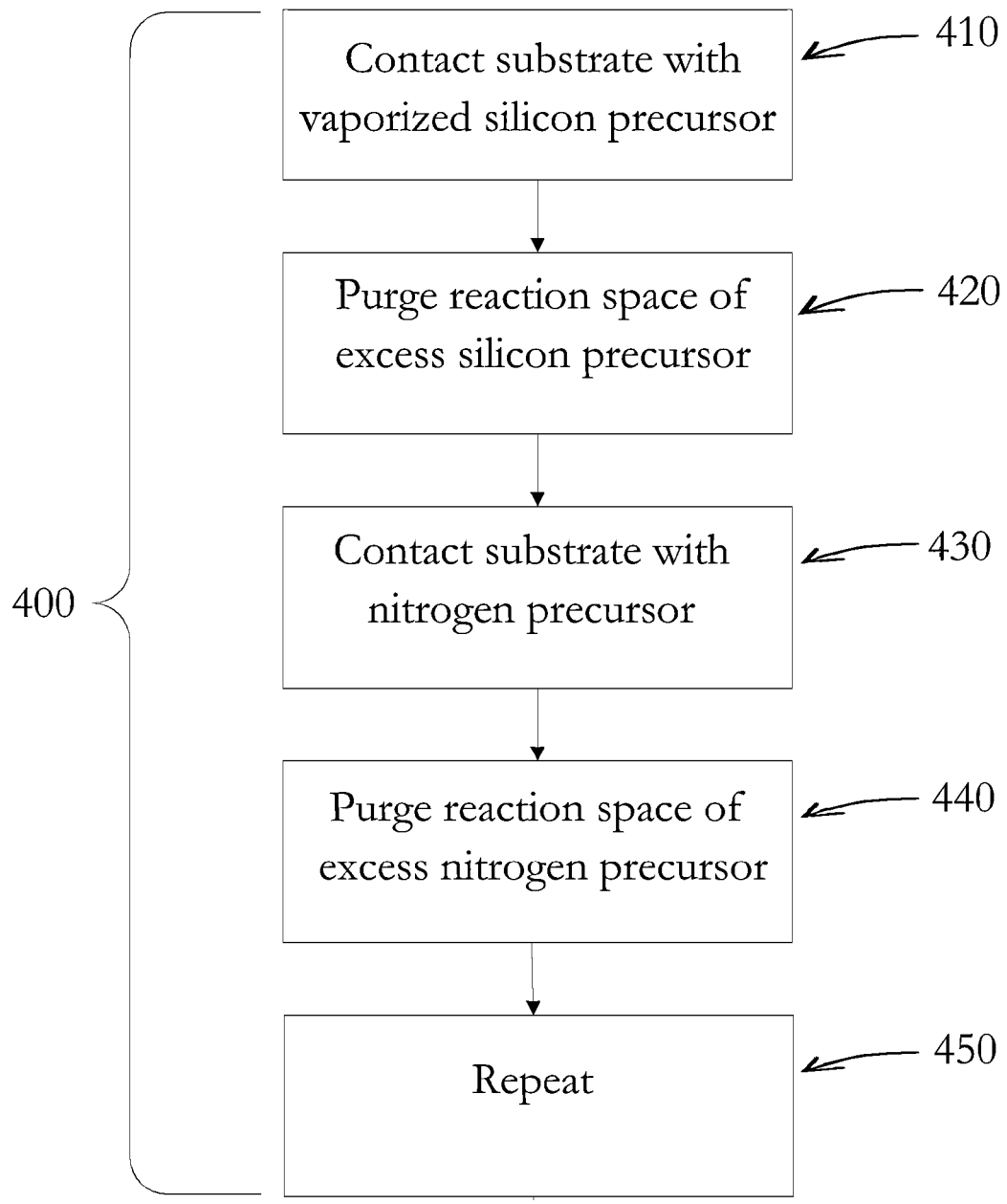
FIG. 4 is a flow chart illustrating a method of forming a silicon nitride thin film by a thermal ALD process in accordance with some embodiments of the present disclosure.

FIG. 4 is a flow chart generally illustrating a silicon nitride thermal ALD deposition cycle that can be used to deposit a silicon nitride thin film in accordance with some embodiments. According to certain embodiment, a silicon nitride thin film is formed on a substrate by an ALD-type process comprising multiple silicon nitride deposition cycles, each silicon nitride deposition cycle 400 comprising:

(1) contacting a substrate with a vaporized silicon precursor 410 such that the silicon compound adsorbs on the substrate surface;

(2) removing excess silicon precursor and any byproducts 420;

(3) contacting the substrate with a nitrogen precursor 430; and (4) removing excess nitrogen precursor and reaction byproducts 440.

The contacting steps are repeated 450 until a thin film of a desired thickness and composition is obtained. As mentioned above, in some embodiments the substrate may be contacted simultaneously with the silicon compound and the nitrogen precursor, while in other embodiments these reactants are provided separately.

According to some embodiments, a silicon nitride thin film is deposited using a thermal ALD process on a substrate having three-dimensional features, such as in a FinFET application. The process may comprise the following steps, not necessarily performed in this order:

(1) a substrate is loaded into a reaction space;

(2) a silicon-containing precursor, such as $H_2SiI_2$, is introduced into the reaction space so that the silicon-containing precursor is adsorbed to a surface of the substrate;

(3) removing excess silicon-containing precursor and reaction byproducts are removed, such as by purging;

(4) a nitrogen-containing precursor, such as $NH_3$ or $N_2H_4$, is introduced into the reaction space to react with the silicon-containing precursor on the substrate;

(5) removing excess nitrogen-containing precursor and reaction byproducts, such as by purging; and (6) steps (2) through (5) may be repeated until a silicon nitride film of a desired thickness is formed.

In some embodiments, the ALD process is performed at a temperature between about 100° C. to about 800° C. or between about 200° C. and about 600° C. or between about 300° C. to about 500° C. In some applications, the reaction temperature is about 400° C.

SiN Film Characteristics

Silicon nitride thin films deposited according to some of the embodiments discussed herein (irrespective of whether the silicon precursor contained bromine or iodine) may achieve impurity levels or concentrations below about 3 at-%, preferably below about 1 at-%, more preferably below about 0.5 at-%, and most preferably below about 0.1 at-%. In some thin films, the total impurity level excluding hydrogen may be below about 5 at-%, preferably below about 2 at-%, more preferably below about 1 at-%, and most preferably below about 0.2 at-%. And in some thin films, hydrogen levels may be below about 30 at-%, preferably below about 20 at-%, more preferably below about 15 at-%, and most preferably below about 10 at-%.

In some embodiments, the deposited SiN films do not comprise an appreciable amount of carbon. However, in some embodiments a SiN film comprising carbon is deposited. For example, in some embodiments an ALD reaction is carried out using a silicon precursor comprising carbon and a thin silicon nitride film comprising carbon is deposited. In some embodiments a SiN film comprising carbon is deposited using a precursor comprising an alkyl group or other carbon-containing ligand. In some embodiments a silicon precursor of one of formulas (9)-(16) and comprising an alkyl group is used in a PEALD or thermal ALD process, as described above, to deposit a SiN film comprising carbon. Different alkyl groups, such as Me or Et, or other carbon-containing ligands may produce different carbon concentrations in the films because of different reaction mechanisms. Thus, different precursors can be selected to produce different carbon concentration in deposited SiN films. In some embodiments the thin SiN film comprising carbon may be used, for example, as a low-k spacer.

Figure 5A:
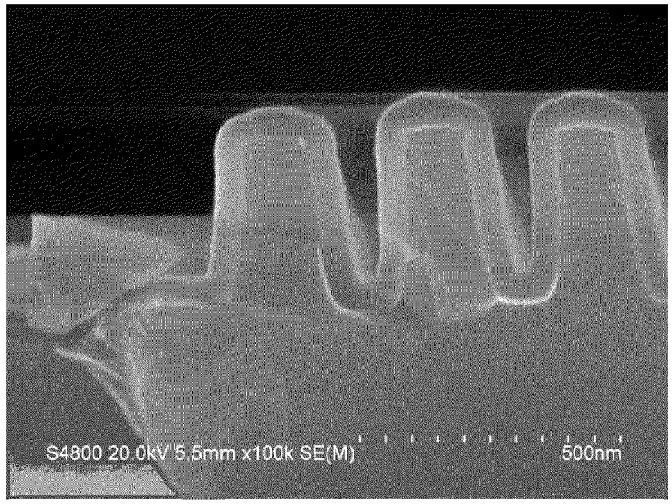
FIGS. 5A-5C illustrate field emission scanning electron microscopy (FESEM) images of various silicon nitride films deposited according to some embodiments of the present disclosure.
Figure 5B:
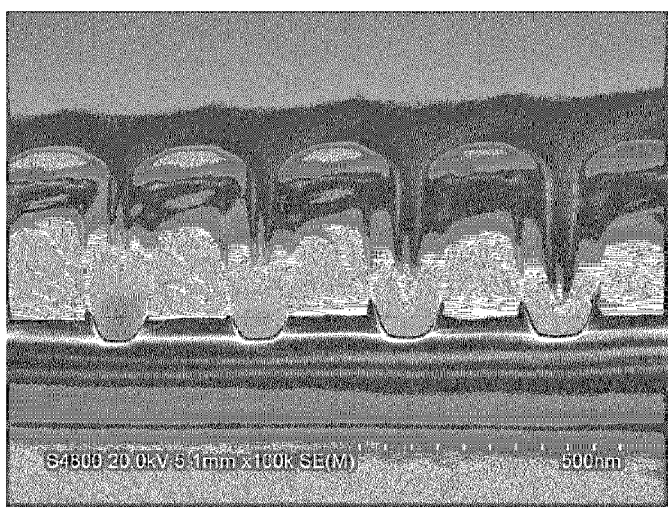
Figure 5C:
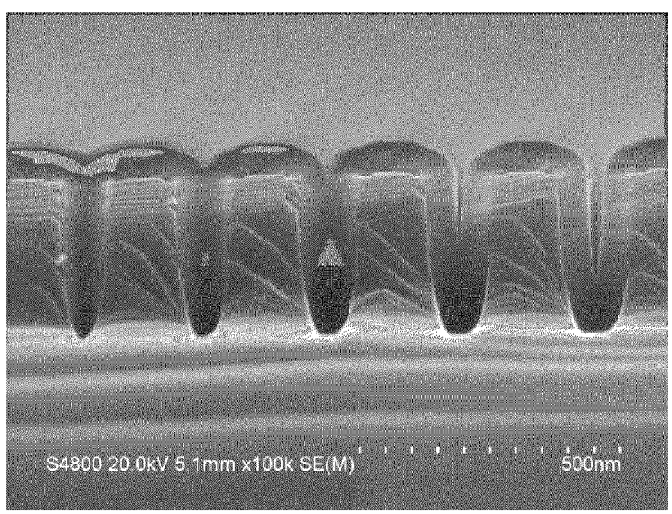
Figure 6A:
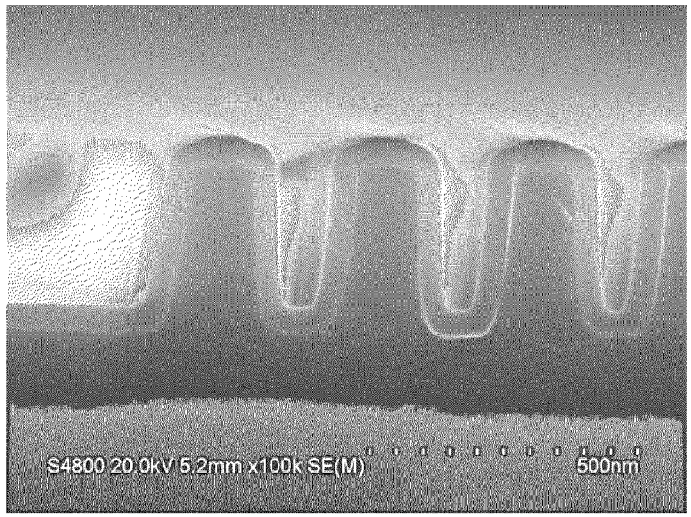
FIGS. 6A-6C illustrate FESEM images of the silicon nitride films of FIGS. 5A-5B after exposure to a 2-minute dHF dip.
Figure 6B:
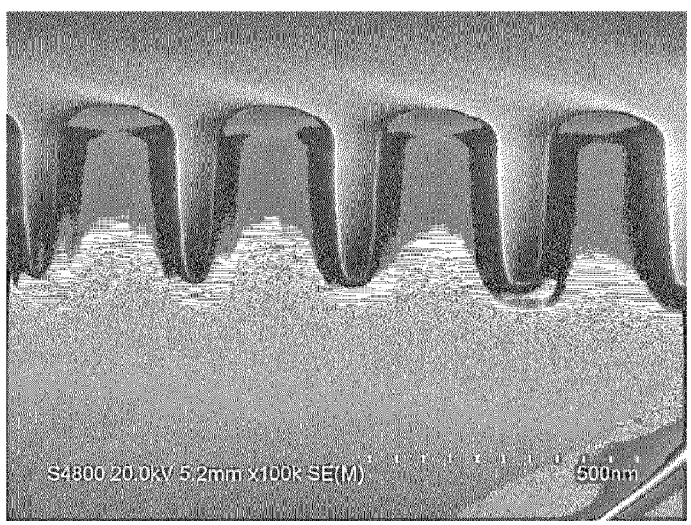
Figure 6C:
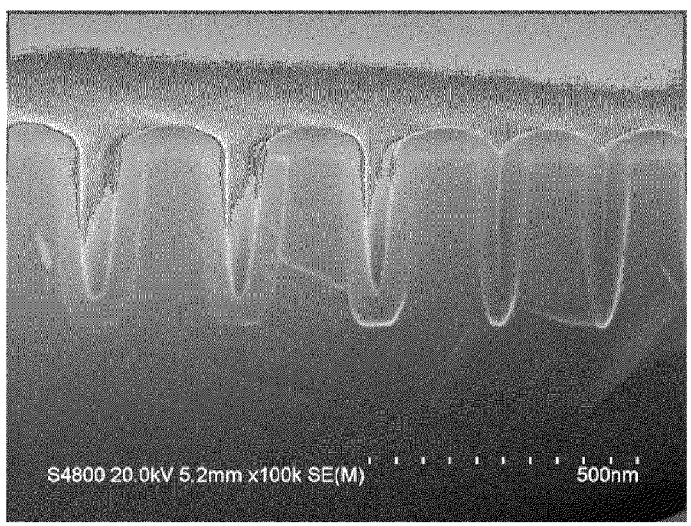

FIGS. 5A-5B show FESEM images of various silicon nitride thin films deposited according to the present disclosure. After the films were deposited, they were HF-dipped for 2 minutes. FIGS. 6A-6C show the same silicon nitride films after the dHF drip process. Uniform etching can be seen.

According to some embodiments, the silicon nitride thin films may exhibit step coverage and pattern loading effects of greater than about 50%, preferably greater than about 80%, more preferably greater than about 90%, and most preferably greater than about 95%. In some cases step coverage and pattern loading effects can be greater than about 98% and in some case about 100% (within the accuracy of the measurement tool or method). These values can be achieved in aspect ratios of more than 2, preferably in aspect ratios more than 3, more preferably in aspect ratios more than 5 and most preferably in aspect ratios more than 8.

As used herein, "pattern loading effect" is used in accordance with its ordinary meaning in this field. While pattern loading effects may be seen with respect to impurity content, density, electrical properties and etch rate, unless indicated otherwise the term pattern loading effect when used herein refers to the variation in film thickness in an area of the substrate where structures are present. Thus, the pattern loading effect can be given as the film thickness in the sidewall or bottom of a feature inside a three-dimensional structure relative to the film thickness on the sidewall or bottom of the three-dimensional structure/feature facing the open field. As used herein, a 100% pattern loading effect (or a ratio of 1) would represent about a completely uniform film property throughout the substrate regardless of features i.e. in other words there is no pattern loading effect (variance in a particular film property, such as thickness, in features vs. open field).

In some embodiments, silicon nitride films are deposited to a thicknesses of from about 3 nm to about 50 nm, preferably from about 5 nm to about 30 nm, more preferably from about 5 nm to about 20 nm. These thicknesses can be achieved in feature sizes (width) below about 100 nm, preferably about 50 nm, more preferably below about 30 nm, most preferably below about 20 nm, and in some cases below about 15 nm. According to some embodiments, a SiN film is deposited on a three-dimensional structure and the thickness at a sidewall may be slightly even more than 10 nm.

According to some embodiments silicon nitride films with various wet etch rates (WER) may be deposited. When using a blanket WER in 0.5% dHF (nm/min), silicon nitride films may have WER values of less than about 5, preferably less than about 4, more preferably less than about 2, and most preferably less than about 1. In some embodiments it could less than about 0.3.

The blanket WER in 0.5% dHF (nm/min) relative to the WER of thermal oxide may be less than about 3, preferably less than about 2, more preferably less than about 1, and most preferably less than about 0.5.

And in some embodiments, the sidewall WER of the three dimensional feature, such as fin or trench relative to the top region WER of a three dimensional feature, such as fin or trench, may be less than about 4, preferably less than about 3, more preferably less than about 2, most preferably about 1.

It has been found that in using the silicon nitride thin films of the present disclosure, thickness differences between top and side may not be as critical for some applications, due to the improved film quality and etch characteristics. Nevertheless, in some embodiments, the thickness gradient along the sidewall may be very important to subsequent applications or processes.

In some embodiments, the amount of etching of silicon nitride films according to the present disclosure may be about one or two times less than amount of etching observed for thermal $SiO_2$ (TOX) in a 0.5% HF-dip process (for example in a process in which about 2 to about 3 nm TOX is removed, one or two times less SiN is removed when deposited according to the methods disclosed herein). The WER of preferred silicon nitride films may be less than that of prior art thermal oxide films.

Specific Contexts for Use of SiN Films

The methods and materials described herein can provide films with increased quality and improved etch properties not only for traditional lateral transistor designs, with horizontal source/drain (S/D) and gate surfaces, but can also provide improved SiN films for use on non-horizontal (e.g., vertical) surfaces, and on complex three-dimensional (3D) structures. In certain embodiments, SiN films are deposited by the disclosed methods on a three-dimensional structure during integrated circuit fabrication. The three-dimensional transistor may include, for example, double-gate field effect transistors (DG FET), and other types of multiple gate FETs, including FinFETs. For example, the silicon nitride thin films of the present disclosure may be useful in nonplanar multiple gate transistors, such as FinFETs, where it may be desirable to form silicide on vertical walls, in addition to the tops of the gate, source, and drain regions.

Another 3D structure for which the SiN deposition techniques taught herein are particularly useful is a 3D elevated source/drain structure, as taught in U.S. Patent Publication No. 2009/0315120 A1 by Shifren et al., the disclosure of which is incorporated herein by reference in its entirety. Shifren et al. teach elevated source/drain structures that include vertical sidewalls.

EXAMPLE 1

A silicon nitride thin film was deposited at 400° C. according to the present disclosure by a PEALD process using $H_2SiI_2$ as the silane precursor and $H_2+N_2$ plasma as the nitrogen precursor. This film exhibited a combination of some of the best qualities of both ALD reaction types: the typical high quality of PEALD SiN films and the isotropic etch behavior of thermal ALD films. While these results are not fully understood, the film properties and etch behavior were nevertheless within the specs for the high quality spacer layer application.

For this application, the step coverage and pattern loading effect on a trench structure with an aspect ratio of 2 should be over 95%, the wet etch rate (WER) should be less than 50% of the WER of thermally oxidized silicon (SiO$_2$, TOX), and the etch rate should be about the same on horizontal and vertical walls of the trench structure. Finally, the growth rate should be over 0.5 nm/min and impurity contents as low as possible.

At 400° C. the film growth rate was 0.52 Å/cycle, and the thickness non-uniformity 6.2% (1–σ). The refractive index was 2.04 with a non-uniformity of 0.7% (1–σ). The growth rate per minute was not yet optimized and was 0.13 nm/min.

The wet etch rate of a planar film was 1.13 nm/minute, which is 46.7% of the WER of Tox (2.43 nm/min). On a trench structure the film conformality was from about 91.0 to about 93.1% and the pattern loading effect from about 95.7 to about 99.3% % as deposited (before etching). After a 2 minute dilute (0.5%) HF etch, the conformality value was from about 91.5 to about 94.6% and the pattern loading effect from about 97.4 to about 99.5% %. The wet etch rate top region of the trench was A 4.32 nm/min, B 2.98 nm/min on the trench sidewall and C 3.03 nm/min on trench bottom. The field areas showed D 2.63 nm/min etch rate.

Without being tied to any particular theory, it is believed that it could be beneficial that the ligand removal step of iodine or bromine is completed before the plasma discharge. That can avoid leftover ligands from decomposing and re-entering the film as impurities, and in the case of halides, the formation of plasma activated halides is also avoided.

The composition of a silicon nitride thin film deposited according to the present disclosure was analyzed by HFS-RBS. The results are shown in Table 1 below. Additionally, XRR data was obtained of the same film. The thickness of the film was determined to be about 117 nm. The mass density was determined to be 2.63 (±0.1) g/cm$^3$. And the surface RMS roughness was determined to be 1.76 (±0.1) nm.

TABLE 1

Film composition measured by HFS-RBS.

| Element | Amount/atom-% | Uncertainty/atom-% |
|---|---|---|
| Si | 32.7 | 1 |
| N | 48.9 | 3 |
| H | 18.3 | 2 |
| Combined impurities | ~0.15 | 0.15 |
| Max. individual impurity | 0.1 | 0.1 |

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A plasma enhanced atomic layer deposition method of depositing a silicon nitride thin film on a substrate in a reaction space comprising:
   (a) introducing a vapor-phase silicon reactant into the reaction space so that the silicon precursor is adsorbed to a surface of the substrate;
   (b) removing excess silicon reactant and reaction byproducts;
   (c) contacting the adsorbed silicon reactant with a reactive species generated by a plasma from a nitrogen precursor;
   (d) removing excess reactive species and reaction byproducts;
   wherein steps (a) through (d) are repeated until a silicon nitride film of a desired thickness is formed and wherein the silicon reactant comprises iodine; and
   wherein a ratio of an etch rate of the silicon nitride thin film in 0.5% aqueous HF in a sidewall of at least one three-dimensional feature to an etch rate of the silicon nitride thin film in 0.5% aqueous HF on a top surface of the at least one three-dimensional feature is less than about 2.

2. The method of claim 1, wherein the silicon reactant comprises a precursor having a formula:

$$H_{2n+2-y-z-w}Si_nI_yA_zR_w$$

wherein, n=1-10, y=from 1 up to 2n+2-z-w, z=from 0 up to 2n+2-y-w, w=from 0 up to 2n+2-y-z, A is a halogen other than I, and R is an organic ligand and can be independently selected from the group consisting of alkoxides, alkylsilyls, alkyl, substituted alkyl, alkylamines and unsaturated hydrocarbon;

$$H_{2n-y-z-w}Si_nI_yA_zR_w$$

wherein, the silicon-containing precursor is a cyclic compound, n=3-10, y=from 1 up to 2n-z-w, z=from 0 up to 2n-y-w, w=from 0 up to 2n-y-z, A is a halogen other than I, and R is an organic ligand and can be independently selected from the group consisting of alkoxides, alkylsilyls, alkyl, substituted alkyl, alkylamines and unsaturated hydrocarbon;

$$H_{2n+2-y-z-w}Si_nI_yA_zR''_w$$

wherein, X is bonded to Si, n=1-10, y=from 0 up to 2n+2-z-w, z=from 0 up to 2n+2-y-w, w=from 1 up to 2n+2-y-z, A is a halogen other than I, and R'' is an organic ligand containing I or Br and can be independently selected from the group consisting of I or Br substitued alkoxides, alkylsilyls, alkyls, alkylamines and unsaturated hydrocarbons;

$$H_{2n-y-z-w}Si_nI_yA_zR''_w$$

wherein, the silicon-containing precursor comprises a cyclic compound, n=3-10, y=from 0 up to 2n+2-z-w, z=from 0 up to 2n+2-y-w, w=from 1 up to 2n+2-y-z, A is a halogen other than I, R'' is an organic ligand containing I or Br and can be independently selected from the group consisting of I or Br substitued alkoxides, alkylsilyls, alkyls, alkylamines and unsaturated hydrocarbons;

$$H_{2n+2-y-z-w}Si_n(EH)_{n-1}I_yA_zR_w$$

wherein, n=2-10, y=from 1 up to 2n+2-z-w, z=from 0 up to 2n+2-y-w, w=from 0 up to 2n+2-y-z, E is N or S, A is a halogen other than I, R is an organic ligand and can be independently selected from the group consisting of alkoxides, alkylsilyls, alkyl, substituted alkyl, alkylamines and unsaturated hydrocarbon;

$$H_{2n+2-y-z-w}Si_n(NH)_{n-1}I_yA_zR_w$$

wherein, n=2-10, y=from 1 up to 2n-2-z-w, z=from 0 up to 2n+2-y-w, w=from 0 up to 2n+2-y-z, A is a halogen other than I, R is an organic ligand and can be independently selected from the group consisting of alkoxides, alkysilyls, alkyl, substituted alkyl, alkymines and unsaturated hydrocarbon;

$$(H_{3-y-z-w}I_yA_zR_wSi)_3-N$$

wherein, y=from 1 up to 3-z-w, z=from 0 up to 3-y-w, w=from 0 up to 3-y-z, A is a halogen other than I, R is an organic ligand and can be independently selected from the group consisting of alkoxides, alkylsilyls, alkyl, substituted alkyl, alkylamines and unsaturated hydrocarbon;

$$H_{2n+2-y-z}Si_nI_yA_z$$

wherein, n=1-10, y=from 1 up to 2n+2-z, z=from 0 up to 2n+2-y, and A is a halogen other than I;

$$H_{2n-y-z}Si_nI_yA_z$$

wherein the precursor is a cyclic compound, n=3-10, y=from 1 up to 2n-z, z=0 up to 2n-y, and A is a halogen other than I; and $$H_{2n+2-y}Si_nI_y$$

wherein, n=1-5 and y=1 up to 2n+2-y.

3. The method of claim 1, wherein the reactive species comprises hydrogen, hydrogen atoms, hydrogen plasma, hydrogen radicals, N*, NH* or NH$_2$* radicals.

4. The method of claim 1, wherein the reactive species are generated directly above the substrate.

5. The method of claim 1, wherein the reactive species are generated away from the substrate.

6. The method of claim 5, wherein a remote plasma generator is used for generating the reactive species.

7. The method of claim 1, wherein the silicon reactant is selected from the group consisting of HSiI$_3$, H$_2$SiI$_2$, H$_3$SiI, H$_2$Si$_2$I$_4$, H$_4$Si$_2$I$_2$, and H$_5$Si$_2$.

8. The method of claim 7, wherein the silicon reactant is H$_2$SiI$_2$.

9. The method of claim 1, wherein the method is performed at a temperature between about 300° C. and about 400° C.

10. The method of claim 1, wherein the nitrogen precursor is selected from the group consisting of NH$_3$, N$_2$H$_4$, an N$_2$/H$_2$ mixture, N$_2$, and any mixtures thereof.

11. The method of claim 1, wherein the silicon nitride thin film exhibits a step coverage and pattern loading effect of at least about 80%.

12. The method of claim 1, wherein an etch rate of the silicon nitride thin film is less than about 4 nm/min in 0.5% aqueous HF.

13. The method of claim 1, wherein the silicon nitride thin film is deposited during the formation a FinFET.

14. A plasma enhanced atomic layer deposition method of depositing a silicon nitride thin film comprising:
(a) loading a substrate having at least one three-dimensional feature into a reaction space;
(b) introducing a silicon-containing precursor into the reaction space so that the silicon precursor is adsorbed to a surface of the substrate;
(c) purging the reaction space of excess silicon-containing precursor and reaction byproducts;
(d) introducing a reactive species generated by a plasma from a nitrogen precursor into the reaction space;
(e) purging the reaction space of excess nitrogen precursor and reaction byproducts; and
repeating steps (b) through (e) until a silicon nitride thin film of a desired thickness is formed;
wherein the silicon-containing precursor comprises iodine,
wherein the silicon nitride thin film has a step coverage of more than about 50% on the at least one three-dimensional feature;
wherein an etch rate of the silicon nitride thin film is less than about 5 nm/min in 0.5% aqueous HF; and
wherein a ratio of an etch rate of the silicon nitride thin film in 0.5% aqueous HF in a sidewall of the at least one three-dimensional feature to an etch rate of the silicon nitride thin film in 0.5% aqueous HF on a top surface of the at least one three-dimensional feature is less than about 2.

15. The method of claim 14, wherein the silicon nitride thin film has a step coverage of more than about 80%.

16. The method of claim 14, wherein the silicon-containing precursor has a formula as in one of following general formulas:

$$H_{2n+2-y-z-w}Si_nI_yA_zR_w$$

wherein, n=1-10, y=from 1 up to 2n+2-z-w, z=from 0 up to 2n+2-y-w, w=from 0 up to 2n+2-y-z, A is a halogen other than I, and R is an organic ligand and can be independently selected from the group consisting of alkoxides, alkylsilyls, alkyl, substituted alkyl, alkylamines and unsaturated hydrocarbon;

$$H_{2n-y-z-w}Si_nI_yA_zR_w$$

wherein, the silicon-containing precursor is a cyclic compound, n=3-10, y=from 1 up to 2n-z-w, z=from 0 up to 2n-y-w, w=from 0 up to 2n-y-z, A is a halogen other than I, and R is an organic ligand and can be independently selected from the group consisting of alkoxides, alkylsilyls, alkyl, substituted alkyl, alkylamines and unsaturated hydrocarbon;

$$H_{2n+2-y-z-w}Si_nI_yA_zR^{II}_w$$

wherein, X is bonded to Si, n=1-10, y=from 0 up to 2n+2-z-w, z=from 0 up to 2n+2-y-w, w=from 1 up to 2n+2-y-z, A is a halogen other than I, and R$^{II}$ is an organic ligand containing I or Br and can be independently selected from the group consisting of I or Br substitued alkoxides, alkylsilyls, alkyls, alkylamines and unsaturated hydrocarbons;

$$H_{2n-y-z-w}Si_nI_yA_zR^{II}_w$$

wherein, the silicon-containing precursor comprises a cyclic compound, n=3-10, y=from 0 up to 2n+2-z-w, z=from 0 up to 2n+2-y-w, w=from 1 up to 2n+2-y-z, A is a halogen other than I, R$^{II}$ is an organic ligand containing I or Br and can be independently selected from the group consisting of I or Br substitued alkoxides, alkylsilyls, alkyls, alkylamines and unsaturated hydrocarbons;

$$H_{2n+2-y-z-w}Si_n(EH)_{n-1}I_yA_zR_w$$

wherein, n=2-10, y=from 1 up to 2n+2-z-w, z=from 0 up to 2n+2-y-w, w=from 0 up to 2n+2-y-z, E is N or S, A is a halogen other than I, R is an organic ligand and can be independently selected from the group consisting of alkoxides, alkylsilyls, alkyl, substituted alkyl, alkylamines and unsaturated hydrocarbon;

$$H_{2n+2-y-z-w}Si_n(NH)_{n-1}I_yA_zR_w$$

wherein, n=2-10, y=from 1 up to 2n+2-z-w, z=from 0 up to 2n+2-y-w, w=from 0 up to 2n+2-y-z, A is a halogen other than I, R is an organic ligand and can be independently selected from the group consisting of alkoxides, alkylsilyls, alkyl, substituted alkyl, alkylamines and unsaturated hydrocarbon;

the substructure —Si-E-Si— wherein, the silicon-containing precursor is a heterocyclic compound comprising I and E is N or S; and

wherein, y=from 1 up to 3−z−w, z=from 0 up to 3−y−w, w=from 0 up to 3−y−z, A is a halogen other than I, and R is an organic ligand and can be independently selected from the group consisting of alkoxides, alkylsilyls, alkyl, substituted alkyl, alkylamines and unsaturated hydrocarbon.

17. The method of claim 14, wherein the silicon-containing precursor is selected from the group consisting of $HSiI_3$, $H_2SiI_2$, $H_3SiI$, $H_2Si_2I_4$, $H_4Si_2I_2$, $H_5Si_2I$, $MeSiI_3$, $Me_2SiI_2$, $Me_3SiI$, $Me_2Si_2I_4$, $Me_4Si_2I_2$, $HMeSiI_2$, $H_2Me_2Si_2I_2$, $EtSiI_3$, $Et_2SiI_2$, $Et_3SiI$, $Et_2Si_2I_4$, $Et_4Si_2I_2$, and $HEtSiI_2$.

18. The method of claim 14, wherein the silicon-containing precursor is $H_2SiI_2$.

19. The method of claim 14, wherein the method is performed at a temperature between about 300° C. and about 400° C.

20. The method of claim 14, wherein the silicon nitride thin film exhibits a step coverage and pattern loading effect of at least about 80%.

21. The method of claim 14, wherein the etch rate of the silicon nitride thin film in a sidewall of the at least one three-dimensional feature to an etch rate of the silicon nitride thin film on a top surface/region of the at least one three-dimensional feature is about 1.

22. The method of claim 14, wherein the etch rate is less than about 3 nm/min.

23. A plasma enhanced atomic layer deposition method of depositing a silicon nitride thin film on a substrate comprising:
(a) exposing the substrate to a vapor-phase silicon precursor so that the silicon precursor is adsorbed to a surface of the substrate;
(b) exposing the substrate to a purge gas and/or a vacuum to remove excess silicon precursor and reaction byproducts from the substrate surface;
(c) contacting the adsorbed silicon precursor with species generated by a nitrogen containing plasma; and
(d) exposing the substrate to a purge gas and/or a vacuum to remove the species of a nitrogen containing plasma and reaction byproducts from the substrate surface and from the proximity of the substrate surface;
wherein steps (a) through (d) are repeated until a silicon nitride film of a desired thickness is formed;
wherein the silicon precursor comprises iodine; and
wherein a ratio of an etch rate of the silicon nitride thin film in 0.5% aqueous HF in a sidewall of at least one three-dimensional feature to an etch rate of the silicon nitride thin film in 0.5% aqueous HF on a top surface of the at least one three-dimensional feature is less than about 2.

24. A plasma enhanced atomic layer deposition method of depositing a silicon nitride thin film on a substrate comprising at least one three-dimensional feature comprising:
(a) exposing the substrate to a vapor-phase silicon reactant so that the silicon reactant is adsorbed to a surface of the substrate;
(b) exposing the substrate to a purge gas and/or a vacuum to remove excess silicon reactant and reaction byproducts from the substrate surface;
(c) contacting the adsorbed silicon reactant with a reactive species generated by a plasma from a nitrogen precursor;
(d) exposing the substrate to a purge gas and/or a vacuum to remove the excess nitrogen precursor from the substrate surface and from the proximity of the substrate surface;
repeating steps (a) through (d) until a silicon nitride thin film of a desired thickness is formed;
wherein the silicon-containing precursor contains iodine;
wherein the silicon nitride thin film has a step coverage of more than about 50%;
wherein an etch rate of the silicon nitride thin film is less than about 5 nm/min in 0.5% aqueous HF; and
wherein a ratio of an etch rate of the silicon nitride thin film in 0.5% aqueous HF in a sidewall of the at least one three-dimensional feature to an etch rate of the silicon nitride thin film in 0.5% aqueous HF on a top surface of the at least one three-dimensional feature is less than about 2.

25. The method of claim 1, wherein a gas comprising nitrogen is provided to the reaction chamber continuously during steps (a)-(d).

* * * * *

UNITED STATES PATENT AND TRADEMARK OFFICE
CERTIFICATE OF CORRECTION

PATENT NO. : 9,824,881 B2
APPLICATION NO. : 13/830084
DATED : November 21, 2017
INVENTOR(S) : Antti Juhani Niskanen et al.

Page 1 of 1

It is certified that error appears in the above-identified patent and that said Letters Patent is hereby corrected as shown below:

On the Title Page

In Column 2 (page 2, item (56)) at Line 54, under Other Publications, change "Hyddrolysis" to --Hydrolysis--.

In the Specification

In Column 16 at Line 60, change "HEt$_2$MeSi$_2$I$_2$HEtMe$_2$Si$_2$I$_2$," to --HEt$_2$MeSi$_2$I$_2$, HEtMe$_2$Si$_2$I$_2$,--.

In the Claims

In Column 22 at Line 50, in Claim 2, change "substitued" to --substituted--.

In Column 22 at Line 59, in Claim 2, change "substitued" to --substituted--.

In Column 23 at Line 5, in Claim 2, change "2n-2" to --2n+2--.

In Column 23 at Line 9, in Claim 2, change "alkysilyls," to --alkylsilyls,--.

In Column 23 at Line 10, in Claim 2, change "alkymines" to --alkylamines--.

In Column 23 at Line 13, in Claim 2, change "I, R" to --I, and R--.

In Column 24 at Line 43 (approx.), in Claim 16, change "substitued" to --substituted--.

In Column 24 at Line 50 (approx.), in Claim 16, change "R$^{II}$is" to --R$^{II}$ is--.

In Column 24 at Line 52 (approx.), in Claim 16, change "substitued" to --substituted--.

Signed and Sealed this
Twenty-eighth Day of May, 2019

Andrei Iancu
*Director of the United States Patent and Trademark Office*